United States Patent
Shirai et al.

(10) Patent No.: US 11,295,947 B2
(45) Date of Patent: Apr. 5, 2022

(54) METHOD FOR PRODUCING OZONE WATER

(71) Applicants: TOHOKU UNIVERSITY, Miyagi (JP); NOMURA MICRO SCIENCE CO., LTD., Kanagawa (JP)

(72) Inventors: Yasuyuki Shirai, Miyagi (JP); Takeshi Sakai, Miyagi (JP); Takayuki Jizaimaru, Kanagawa (JP)

(73) Assignees: TOHOKU UNIVERSITY, Miyagi (JP); NOMURA MICRO SCIENCE CO., LTD., Kanagawa (JP)

( * ) Notice: Subject to any disclaimer, the term of this patent is extended or adjusted under 35 U.S.C. 154(b) by 30 days.

(21) Appl. No.: 17/045,615

(22) PCT Filed: Apr. 26, 2019

(86) PCT No.: PCT/JP2019/017835
§ 371 (c)(1),
(2) Date: Oct. 6, 2020

(87) PCT Pub. No.: WO2019/212037
PCT Pub. Date: Nov. 7, 2019

(65) Prior Publication Data
US 2021/0163850 A1    Jun. 3, 2021

(30) Foreign Application Priority Data
May 2, 2018   (JP) .............................. JP2018-088715

(51) Int. Cl.
*C11D 3/39*      (2006.01)
*H01L 21/02*     (2006.01)
(Continued)

(52) U.S. Cl.
CPC .... *H01L 21/02057* (2013.01); *B01F 3/04439* (2013.01); *B01F 3/2284* (2013.01);
(Continued)

(58) Field of Classification Search
CPC .................................................. C11D 11/0047
(Continued)

(56) References Cited

U.S. PATENT DOCUMENTS

| 5,632,847 | A | * | 5/1997 | Ohno | ................... B29C 63/0013 134/31 |
| 2010/0193977 | A1 | | 8/2010 | Yamamoto et al. | |
| 2013/0079269 | A1 | | 3/2013 | Koike et al. | |

FOREIGN PATENT DOCUMENTS

| JP | 2001-035827 | 2/2001 |
| JP | 2007-236706 | 9/2007 |

(Continued)

OTHER PUBLICATIONS

"Eiken Techno," http://www.eiken-techno.co.jp/ and http://www.eiken-techno.co.jp/ozonewater.html retreived on or before May 1, 2018.
(Continued)

*Primary Examiner* — Gregory E Webb
(74) *Attorney, Agent, or Firm* — Greenblum & Bernstein P.L.C.

(57) ABSTRACT

Conventional ozone water is still insufficient in the removal rate and cleaning ability of resist required in today's semiconductor manufacturing field, and it does not fully meet the expectation of further improvement in the effects of sterilization, deodorization, and cleaning in the fields such as cleaning of foodstuffs, cleaning of process equipment and tools, and cleaning of fingers, as well as in the fields such as deodorization, sterilization, and preservation of freshness of foodstuffs. The above problem can be solved by defining the values of a plurality of specific production parameters in the production of ozone water into specific ranges.

4 Claims, 13 Drawing Sheets

(51) Int. Cl.
*B08B 3/10* (2006.01)
*B01F 3/04* (2006.01)
*B01F 3/22* (2006.01)
*B08B 3/08* (2006.01)
*C02F 1/68* (2006.01)
*C11D 3/04* (2006.01)
*C11D 11/00* (2006.01)
*G03F 7/42* (2006.01)

(52) U.S. Cl.
CPC ............... *B08B 3/08* (2013.01); *B08B 3/10* (2013.01); *C02F 1/68* (2013.01); *C11D 3/04* (2013.01); *C11D 3/3947* (2013.01); *C11D 11/0047* (2013.01); *G03F 7/423* (2013.01); *B01F 2003/04886* (2013.01); *B01F 2215/008* (2013.01); *B01F 2215/0077* (2013.01); *B01F 2215/044* (2013.01); *B08B 2203/005* (2013.01); *B08B 2203/007* (2013.01)

(58) Field of Classification Search
USPC ........................................................ 510/175
See application file for complete search history.

(56) References Cited

FOREIGN PATENT DOCUMENTS

| | | |
|---|---|---|
| JP | 2009-056442 | 3/2009 |
| JP | 2009-297588 | 12/2009 |
| JP | 2012-000578 | 1/2012 |
| WO | 01/05702 A1 | 1/2001 |

OTHER PUBLICATIONS

"Sharp High-Concentration Ozone Production Unit," Apr. 20, 2012, http://www.sharp.co.jp/sms/release/ozon2/ozon2.html.
"Development of Semiconductor Cleaning Technologies Using Micro- and Nano-bubble Technologies," AIST, http://optc.co.jp/rd-img/takahashi.pdf, pp. 1-12; Sep. 5, 2013.
ISR issued in WIPO Patent Application No. PCT/JP2019/017835, dated Jun. 11, 2019, English translation.
Written Opinion issued in WIPO Patent Application No. PCT/JP2019/017835, dated Jun. 11, 2019, English translation.

* cited by examiner

[fig.1]
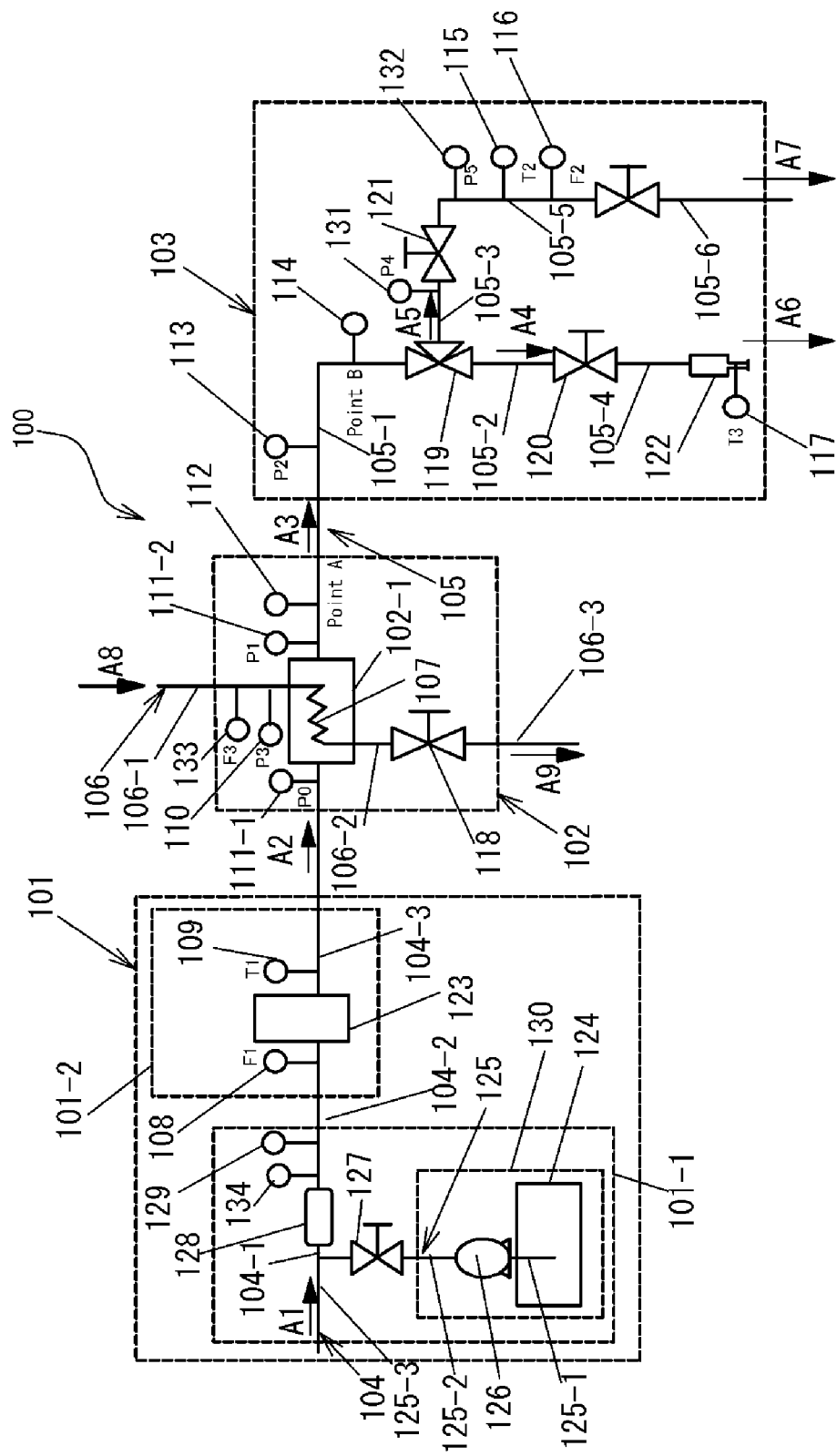

[fig.2]
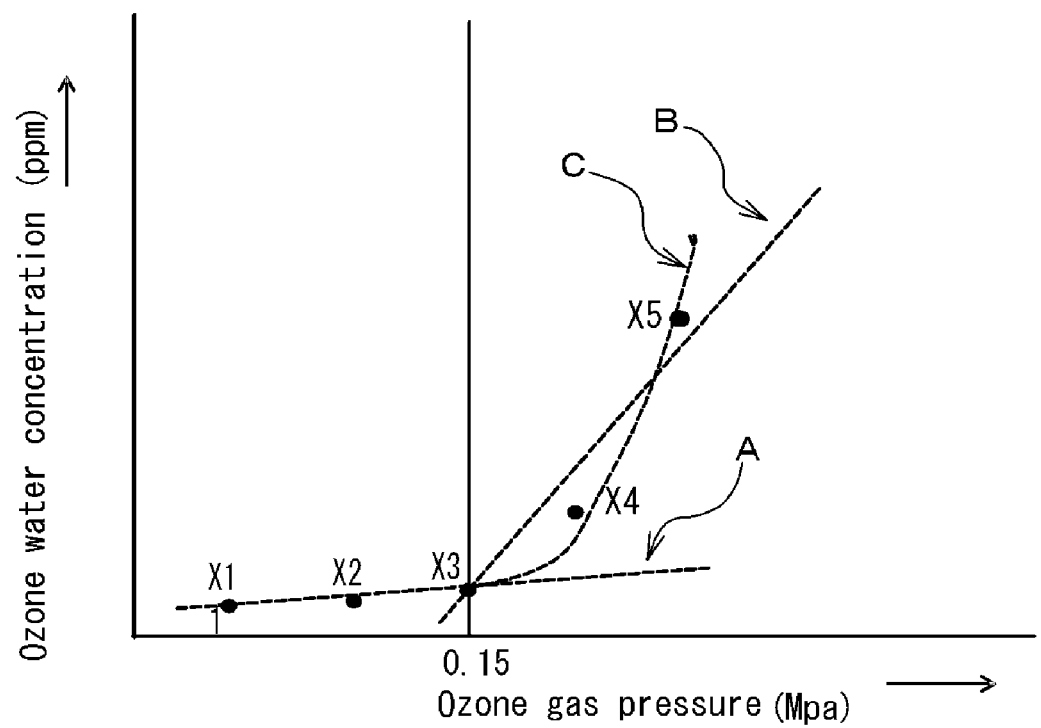

[fig.3]
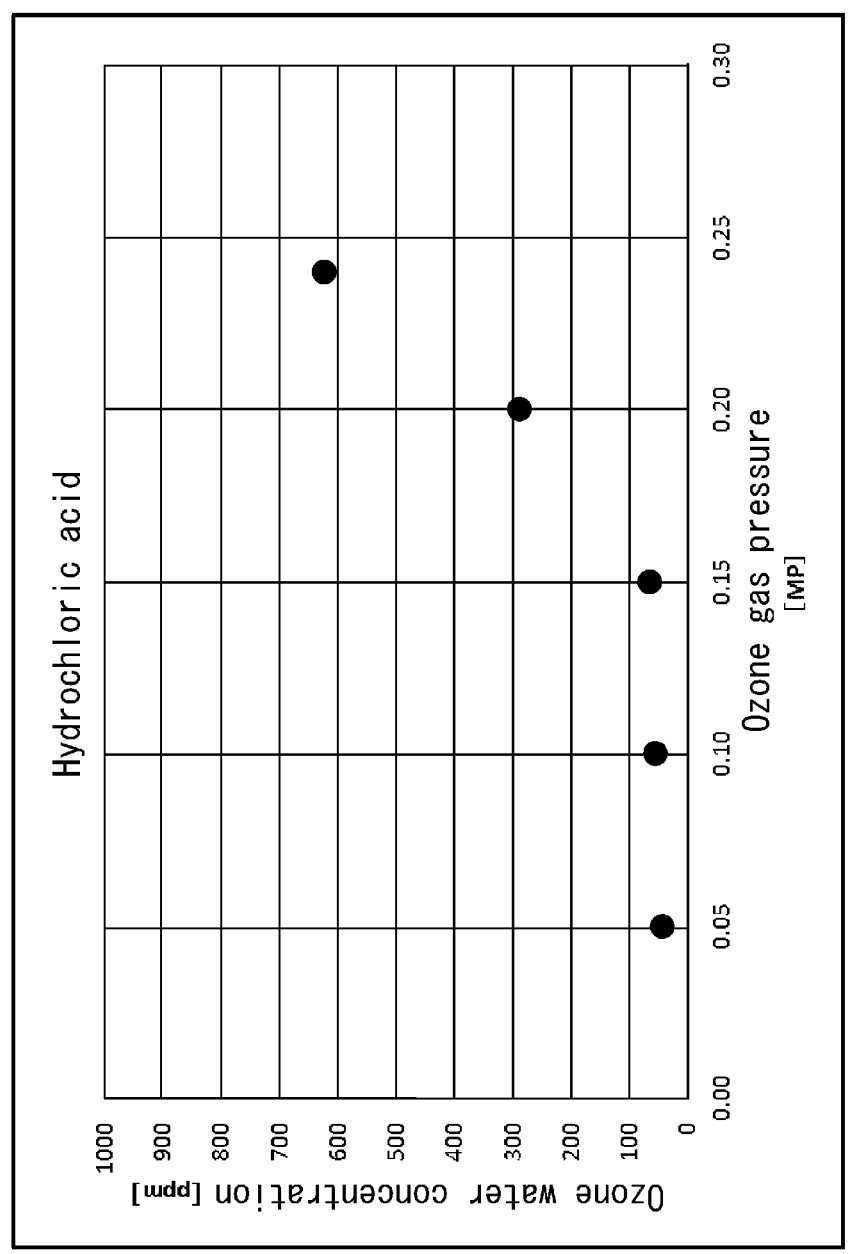

[fig.4]
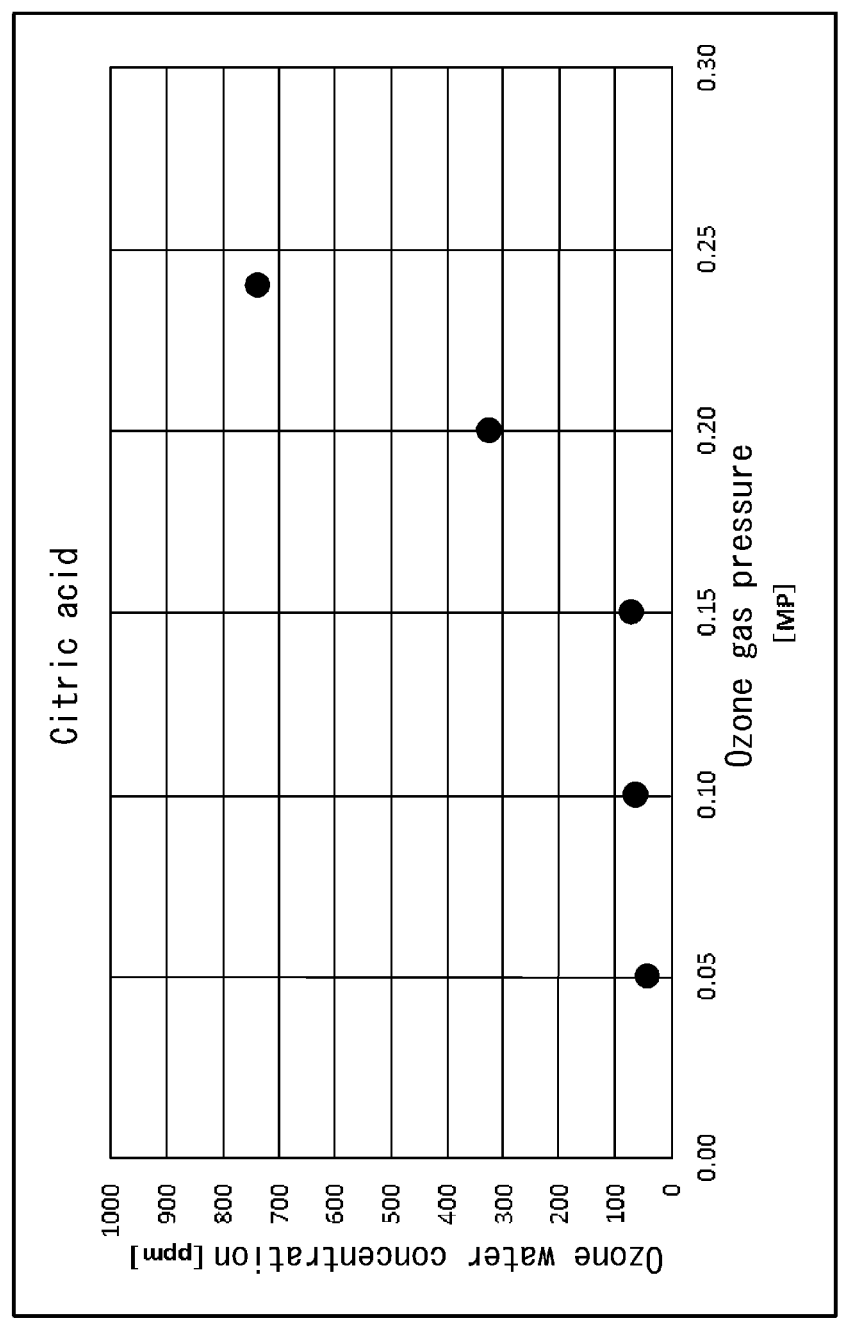

[fig.5]
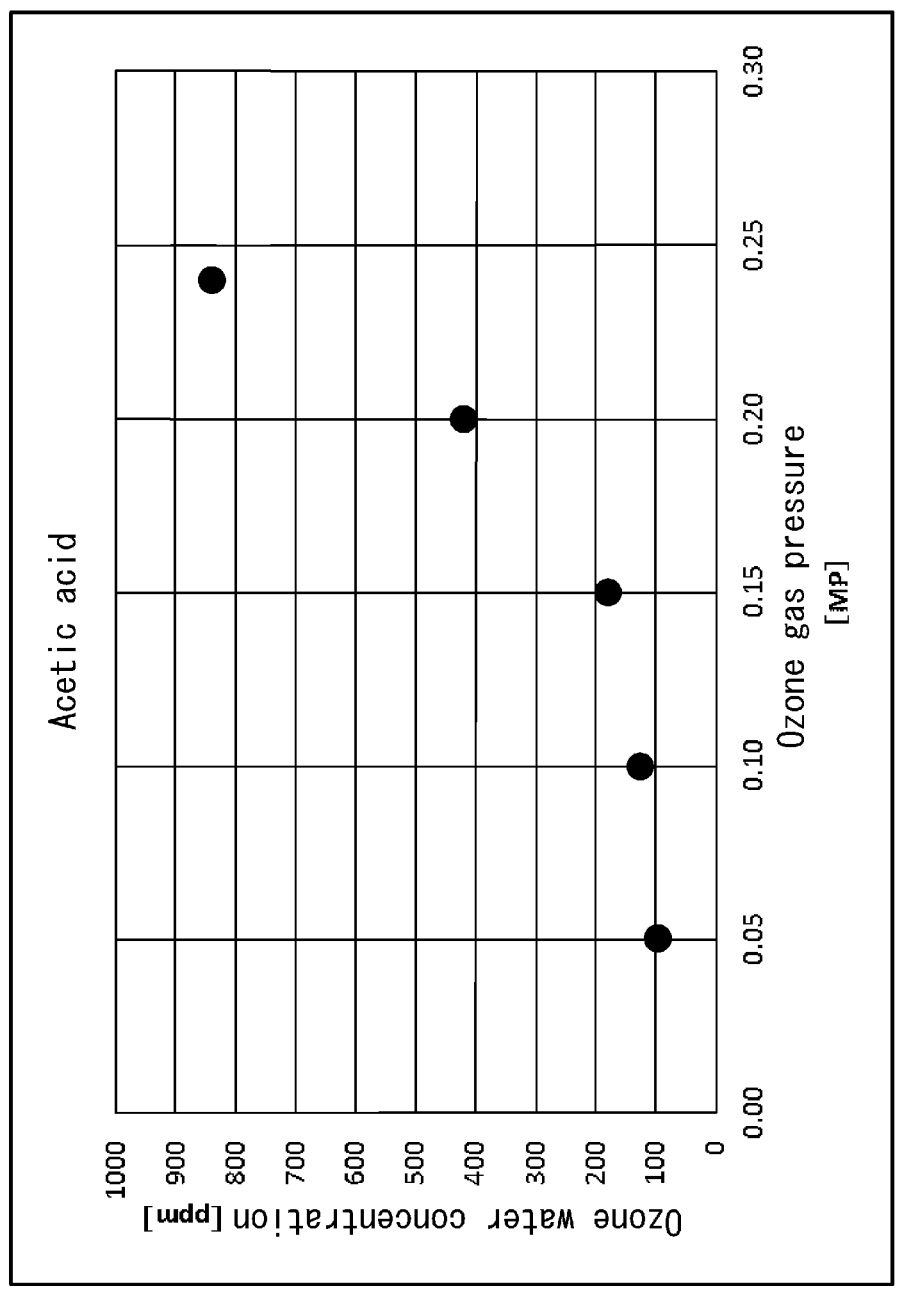

[fig.6]
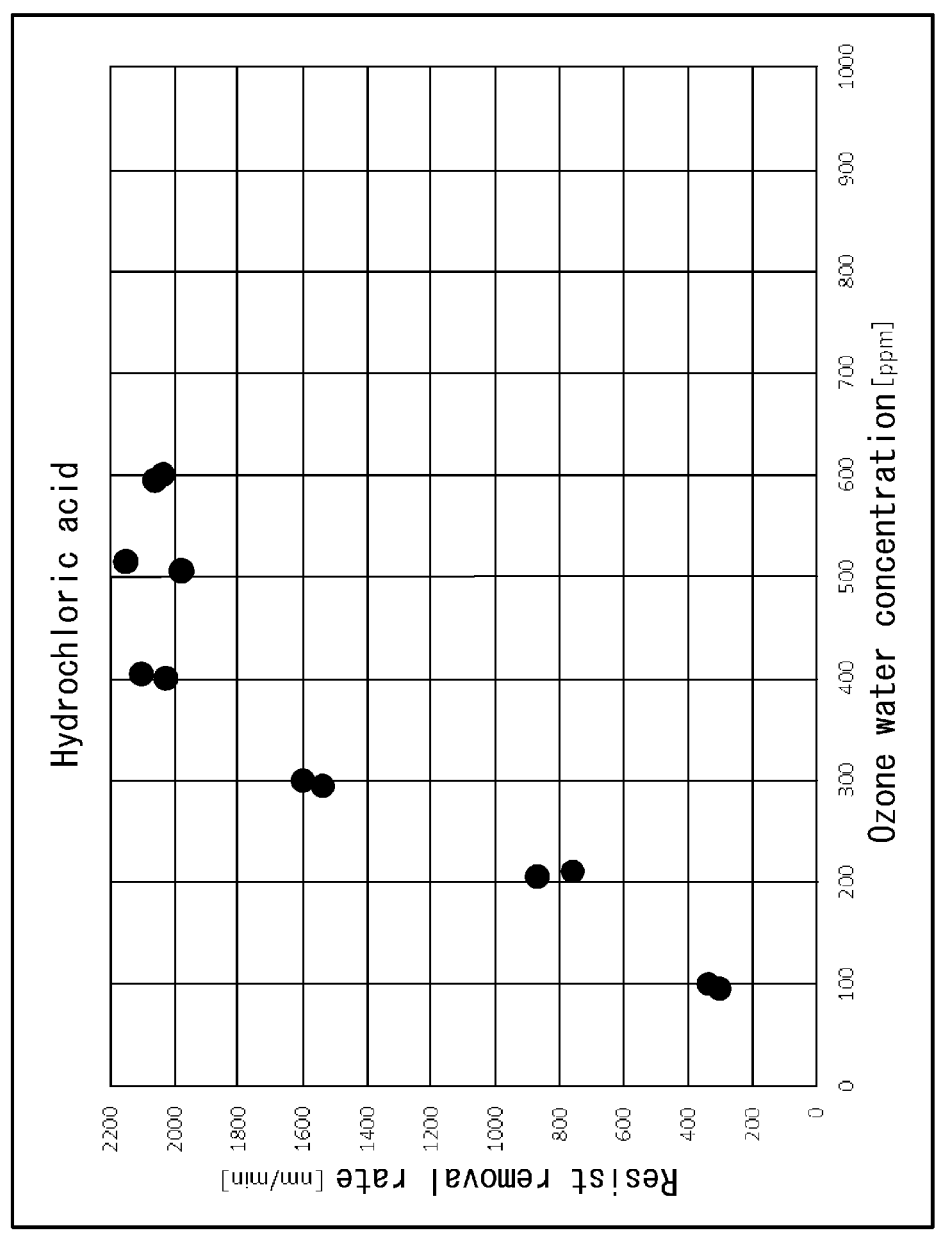

[fig.7]
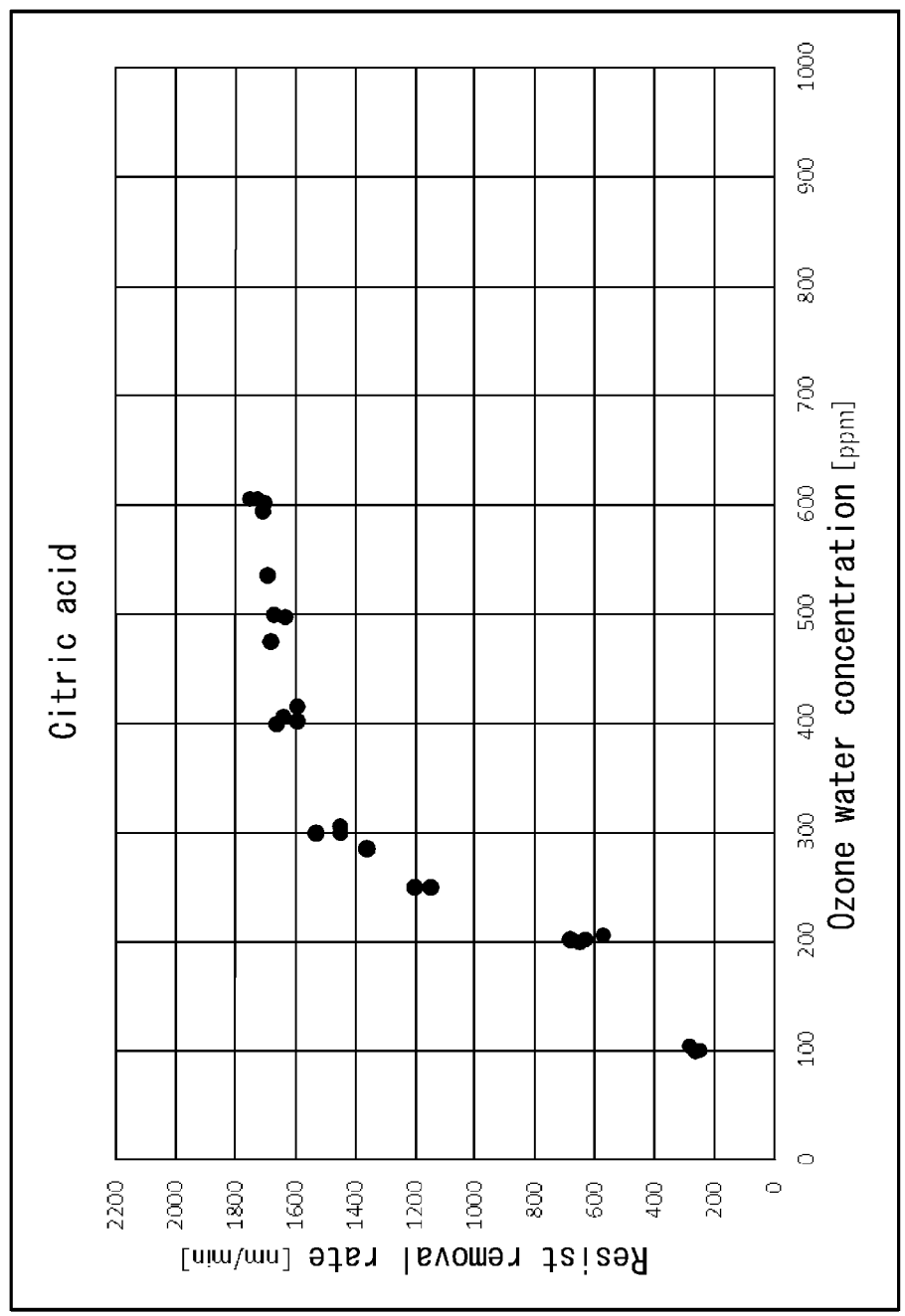

[fig.8]
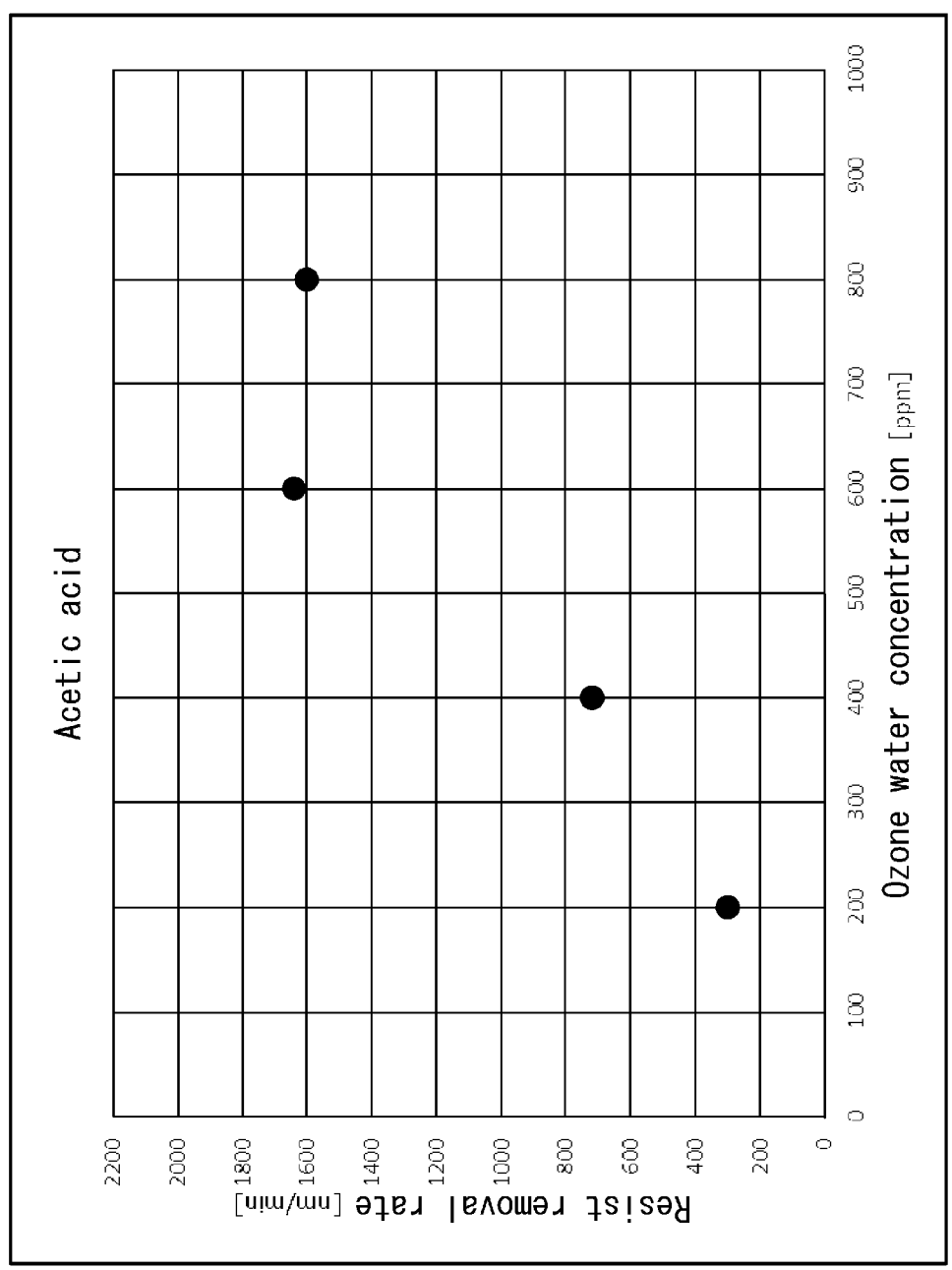

[fig.9]
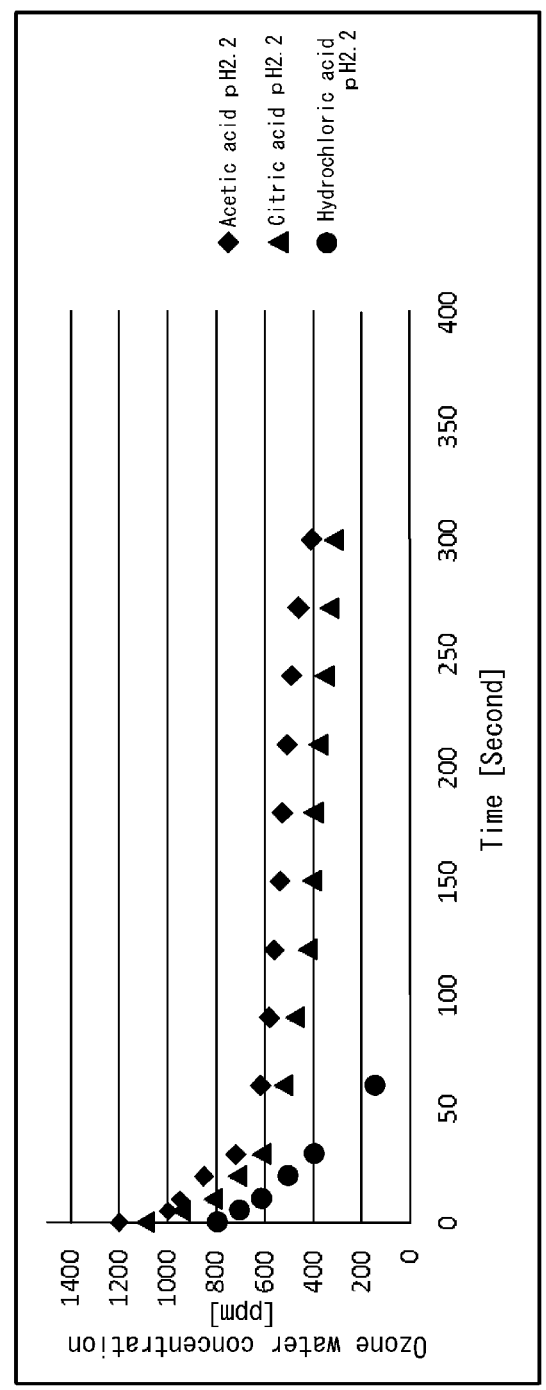

[fig.10]
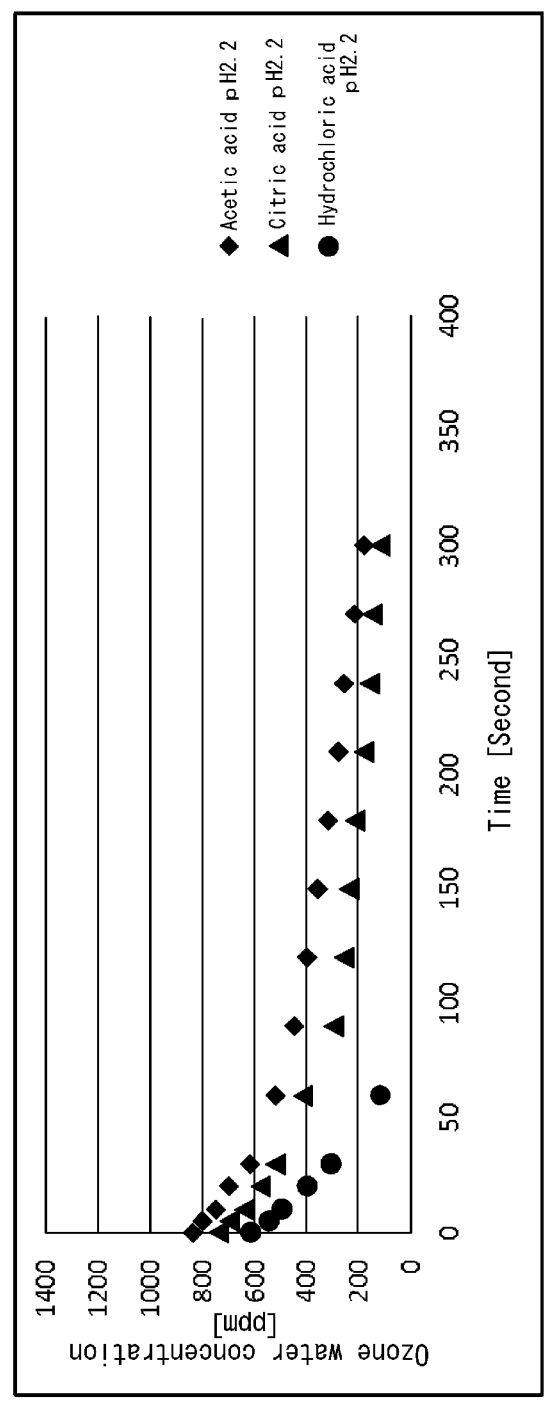

[fig.11]
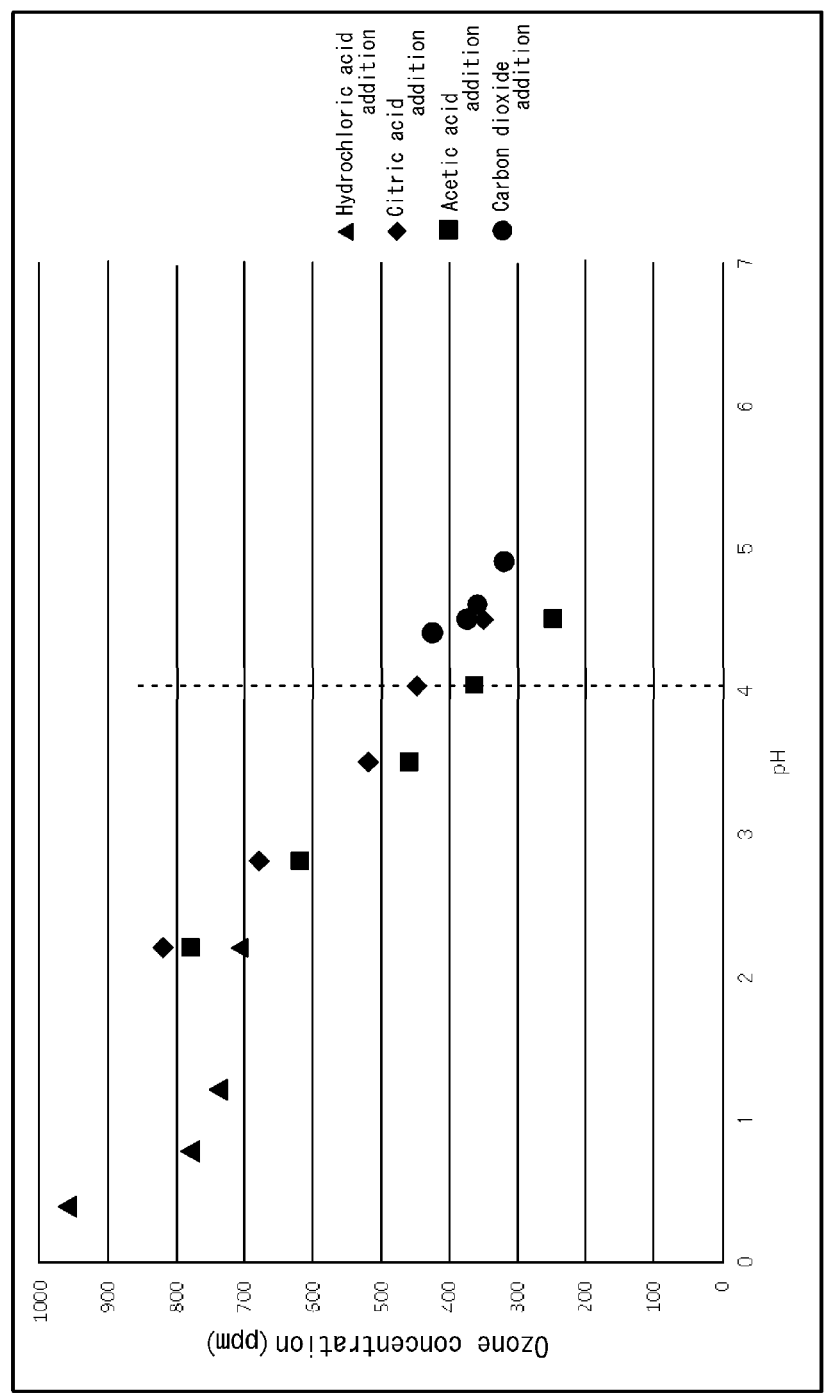

[fig.12]
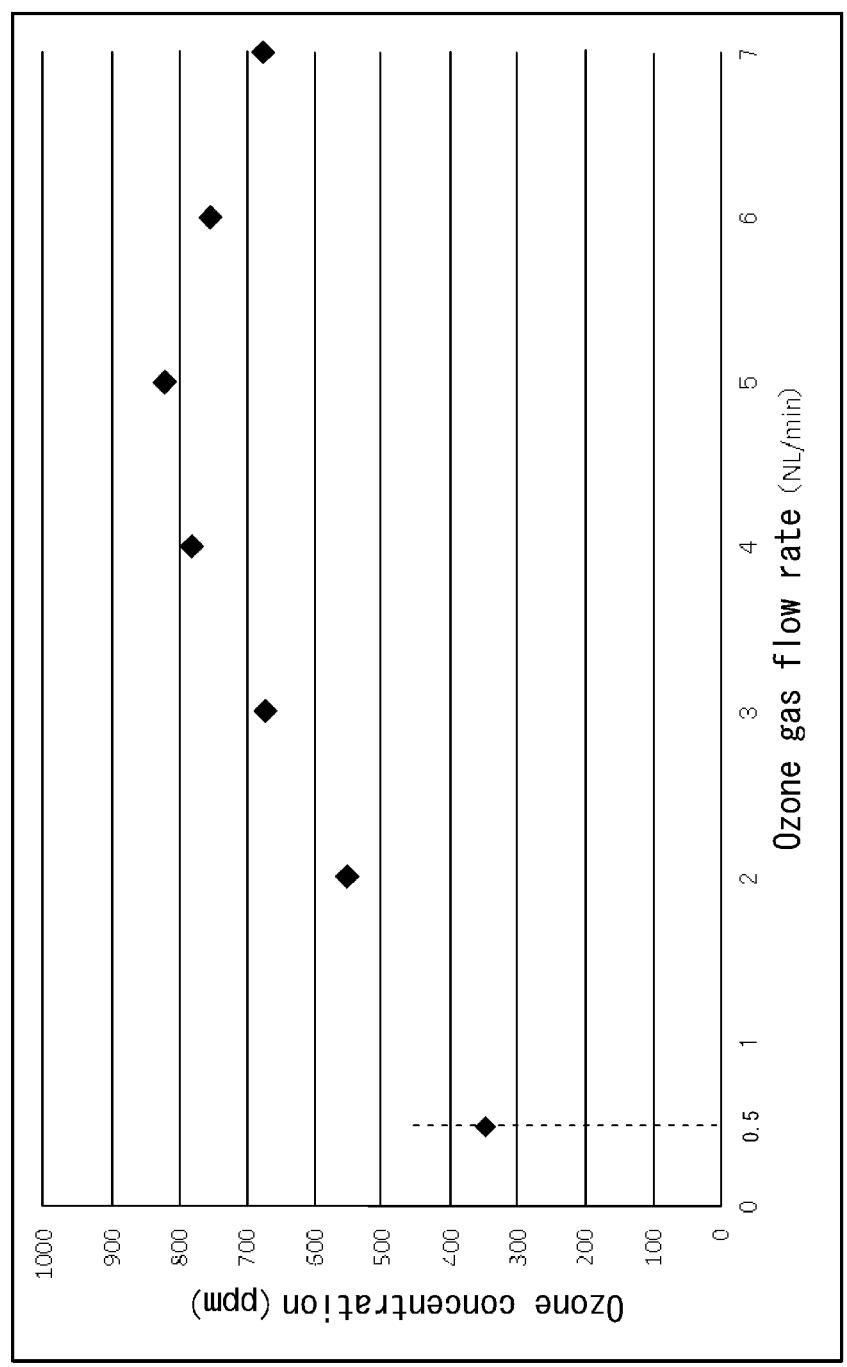

[fig.13]
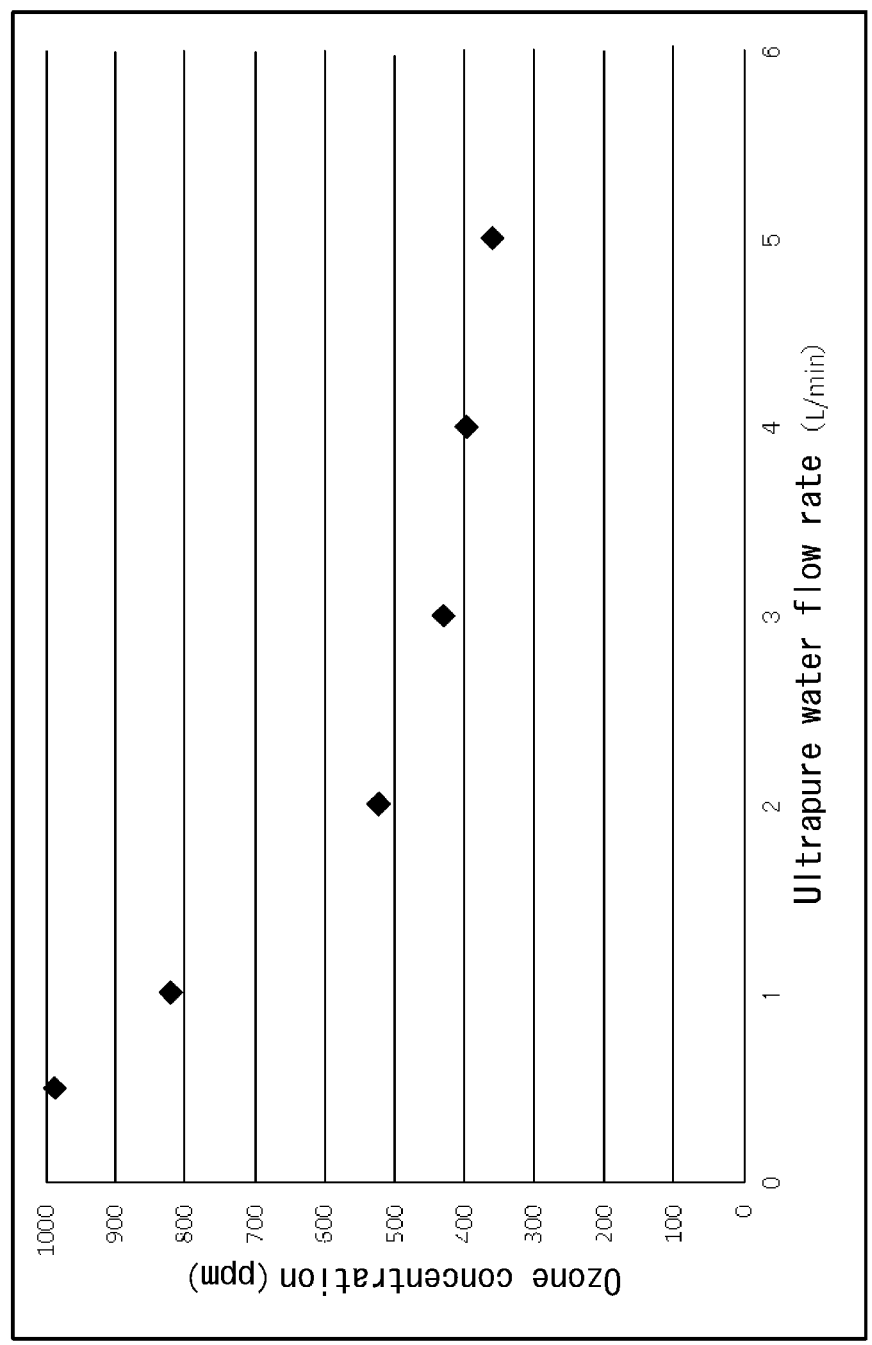

METHOD FOR PRODUCING OZONE WATER

TECHNICAL FIELD

The present invention relates to a method for producing ozone water, and further relates to a treatment method using ozone water obtained in the production method and the ozone water.

BACKGROUND ART

In a field of producing functional electric devices such as semiconductor substrates, liquid crystal displays, or organic EL displays, and photomasks or the like used in the manufacturing process thereof, there is a step of peel-off cleaning of unnecessary resist from a member surface to which a resist such as a photoresist used in the manufacturing process is attached (hereinafter, "cleaning removal" or simply "removal" or "cleaning"). In the resist peeling and cleaning, usually, first, the resist is peeled off by SPM (sulfuric-acid and hydrogen-peroxide mixture) ($H_2SO_4/H_2O_2/H_2O$) cleaning using a sulfuric acid/hydrogen peroxide aqueous solution obtained by mixing sulfuric acid and hydrogen peroxide water with respect to the surfaces of the resist attachment members. Thereafter, wet cleaning such as APM (mixed solution of ammonia and hydrogen peroxide) cleaning with an aqueous solution of ammonia and hydrogen peroxide (APM), HPM (mixed solution of hydrochloric acid, hydrogen peroxide and pure water) cleaning with an aqueous solution of hydrochloric acid and hydrogen peroxide (HPM), and DHF (mixed solution of hydrochloric acid, hydrogen peroxide and pure water) cleaning with dilute hydrofluoric acid (DHF) are performed. Thereafter, drying is performed to complete a series of cleaning processes.

Currently, hot concentrated sulfuric acid is the mainstream for cleaning and removing the resist, but a large amount of energy and cost are required to dispose of the concentrated sulfuric acid, and this is a large environmental load. In addition, the above-mentioned other cleaning liquids have the same problem to a greater or lesser extent.

In recent years, there has been proposed a method of using ozone water as an alternative, which has fewer contaminants than conventional cleaning and changes into harmless substances over time (less residual chemicals)

To improve the cleaning effect of ozone water, the following methods have been proposed:
(1) To improve the ozone concentration (dissolved ozone concentration) in ozone water (e.g., PTL 1: Japanese Laid-Open Patent Application No. 2012-578), and
(2) To form high temperature ozone water (e.g., PTL 2: Japanese Laid-Open Patent Application No. 2009-56442, Non-PTL 1, Non-PTL 2.

PTL 1 describes in FIG. 2, ozone waters having ozone concentrations of 347 mg/L and 370 mg/L, although there is no description of temperature. PTL 2 describes in FIG. 3, high temperature ozone waters having an ozone water temperature of 50° C., with an ozone concentration of ozone water of 135 mg/L, and an ozone water temperature of 80° C. with an ozone concentration of ozone water of 85 mg/L.

Non-PTL 1 describes high temperature ozone water having an ozone water temperature of 70° C. with an ozone concentration of ozone water of 200 mg/L. Non-PTL 2 describes high temperature ozone water having an ozone water temperature of 75° C. with an ozone concentration of ozone water of 120 mg/L.

PATENT LITERATURE

PTL 1: Japanese Laid-Open Patent Application No. 2012-578
PTL 2: Japanese Laid-Open Patent Application No. 2009-56442

NON PATENT LITERATURE

Non-PTL 1: "Eiken Techno"
HP:http://www.eiken-techno.co.jp/
HP:http://www.eiken-techno.co.jp/ozonewater.html
Non-PTL 2: "Sharp High-Concentration Ozone Production Unit" Apr. 20, 2012
HP:http://www.sharp.co.jp/sms/release/ozon2/ozon2.html
Non-PTL 3: "Development of Semiconductor Cleaning Technologies Using Micro- and Nanobubble Technologies" AIST
http://optc.co.jp/rd-img/takahashi.pdf.

SUMMARY OF INVENTION

Technical Problem

However, the low-temperature ozone water having the concentrations described in PTL 1 and the high-temperature ozone waters having the degree of ozone concentration described in PTL 2 and Non-PTL 1 and 2, are still insufficient in the removal rate and the cleaning power of the resist required in the field of semiconductor manufacturing today. They also do not fully meet the expectation of further improvement of sterilization, deodorization, and cleaning effects in such fields as cleaning of foodstuffs, cleaning of process equipment and tools, and cleaning of fingers, as well as in such fields as deodorization, sterilization, and preservation of freshness of foodstuffs.

The reason for this is that, in the above-mentioned conventional method for producing ozone water, only so-called partial optimization is performed in order to optimize a part of the ozone water production conditions (production parameters) for each problem as described above, and the overall optimization is not performed in the organic relation between the kinds of parameters sufficient for the production of ozone water. For this reason, at the present stage, it is used only in a limited manner, even if it is used, and it has not been widely used in practical use. Moreover, in the conventional method, a large-sized apparatus is inevitably required for producing high-temperature and high-concentration ozone water.

The present invention has been made in view of the above-mentioned points, and has been made on the basis of the finding of a specific experimental result in the process of a number of try-and-errors of trial manufacture, confirmation experiment, analysis and review to find out what parameters of manufacturing parameters (sometimes referred to as "production parameters") related to the production of ozone water should be specified in what values, and all of the constituent materials and related parameters should be used to find out the optimum conditions so that the ozone concentration of ozone water can be raised to a wider practical use and the treatment target material can be substantially maintained at a high temperature for a sufficient time to properly treat the treatment target material in a high temperature state.

One object of the present invention is to provide a method for producing a high concentration ozone water at a low temperature to a high temperature in order to achieve overall optimization, a resist treatment method using a high concentration ozone water at a low temperature to a high temperature obtained by the production method.

Another object of the present invention is to provide a method for producing a high concentration heated ozone water capable of producing heated ozone water having extremely high concentration of (dissolved) ozone by suppressing attenuation of dissolved ozone concentration in high concentration ozone water, a high concentration heated ozone water obtained by the production method, and a resist treatment liquid using the same.

Another object of the present invention is to provide a method for producing high concentration ozone water of low temperature to high temperature, which is more excellent in realizing high concentration of low temperature to high temperature suitable for versatility, and which requires no enlargement of the apparatus but facilitates simplification of the apparatus, and a resist treatment method using high concentration ozone water of low temperature to high temperature obtained by the method.

Another object of the present invention is to provide an ozone water that can fully meet the expectations of further improvements in disinfecting, deodorizing, and cleaning effects in the fields such as cleaning of foodstuffs, cleaning of processing equipment and tools, cleaning of fingers, and also in the fields such as deodorizing, disinfecting, and maintaining freshness of foods.

Solution to Problem

One aspect of the invention lies in a process for producing ozone water comprising the following steps:
Step A: a step of preparing a solution A in which at least one of hydrochloric acid, acetic acid, and citric acid is added to pure water to adjust pH to a predetermined value (pH);
Step B: a step of dissolving ozone gas supplied at a predetermined supply flow rate (Fo) and a predetermined supply pressure (Po) into solution A supplied at a predetermined supply flow rate (Fw) and a predetermined supply pressure (Pw) to generate solution B; and
Step C: a step of heating any of the pure water, the solution A, and the solution B so that the liquid temperature of the ozone water to be generated becomes a predetermined temperature, wherein:
(1) the predetermined value (pH) in Process A is 4 or less,
(2) a concentration (N) (g/Nm3) of ozone gas is within a range of 200 g per Nm3≤N,
(3) Po and Pw are within the following ranges:
  0.15 MPa≤Po≤0.695 MPa,
  0.15 MPa<Pw≤0.7 MPa,
a value of (Pw−Po) is within the following range:
  0.005 MPa≤(Pw−Po)≤0.2 MPa,
and, a relation between Po and Pw is:
Po<Pw;
(4) Fo and Fw are within the following ranges:
  0.25 NL/min≤Fo≤80 NL/min
  0.5 L/min≤Fw≤40 L/min,
(5) the predetermined temperature in Step C is within a range of from 60° C. to 90° C.,
and
(6) Step C is performed at a timing that includes at least before, after, or concurrently with Step B.
Said one aspect of the present invention also lies in ozone water obtained by the production method and a treatment liquid or the treatment liquid using the same.

Another aspect of the invention lies in a process for producing ozone water comprising the following steps:
Step A: a step of preparing a solution A in which at least one of hydrochloric acid, acetic acid, and citric acid is added to pure water to adjust pH to a predetermined value (pH);
Step B: a step of dissolving ozone gas supplied at a predetermined supply flow rate (Fo) and a predetermined supply pressure (Po) into solution A supplied at a predetermined supply flow rate (Fw) and a predetermined supply pressure (Pw) to generate solution B; and
Step C: a step of heating any of the pure water, the solution A, and the solution B so that the liquid temperature of the ozone water to be generated becomes a predetermined temperature, wherein:
(1) the predetermined value (pH) in Step A is 4 or less,
(2) a concentration (N) (g/Nm3) of ozone gas is within a range of 200 g per Nm3≤N,
(3) Po and Pw are within the following ranges:
  0.15 MPa≤Po≤0.695 MPa,
  0.15 MPa<Pw≤0.7 MPa,
a value of (Pw−Po) is within the following range:
  0.005 MPa≤(Pw−Po)≤0.2 MPa,
and, a relation between Po and Pw is:
Po<Pw; and
(4) Fo and Fw are within the following ranges:
  0.25 NL/min≤Fo≤80 NL/min
  0.5 L/min≤Fw≤40 L/min.
Said another aspect of the present invention also lies in ozone water obtained by the production method and a treatment liquid or a treatment method using the treatment liquid using the same.

Note that, in the above description, "MPa" represents megapascal in unit notation, and hereinafter it may be referred to as "MP" in some cases.
"g/Nm3" represents the gas concentration in mass per unit volume in the standard state, and in the present application, the measured gas concentration (value at temperature and pressure at the time of measurement) is converted into the standard gas concentration in mass.
"NL/min" is the measured value of the gas flow rate "L/min" per unit time (minutes) (value at temperature and pressure at the time of measurement) converted into the value in the normal state.
In the relevant instrument installed in the ozone water production and supply system used in the experiment described later, a value automatically converted to a standard state value is displayed.

Advantageous Effects of Invention

According to the present invention, it is possible to provide a method for producing high-temperature and high-concentration ozone water having an overall optimization, a high-temperature and high-concentration ozone water obtained by the production method, a treatment liquid using the same, and a treatment method using the same.

Separately, according to the present invention, it is possible to provide a method for producing a high-concentration ozone water having an overall optimization, a high concentration of ozone water obtained by the production method, a treatment liquid using the same, and a treatment method using the same.

Further, according to the present invention, it is possible to provide a method for producing ozone water capable of producing ozone water of extremely high ozone concentration by suppressing the attenuation of ozone concentration in ozone water, ozone water obtained by the production method and a treatment liquid or a treatment method using the treatment liquid.

Other features and advantages of the present invention will become apparent from the following description taken in conjunction with the accompanying drawings. In the accompanying drawings, the same or similar components are denoted by the same reference numerals.

BRIEF DESCRIPTION OF DRAWINGS

The accompanying drawings are included in and constitute a part of the specification, and illustrate embodiments of the invention and are used to describe the principles of the invention together with its description.

FIG. 1 is a schematic configuration diagram for explaining a configuration of an ozone water production and supply system used in an experiment of the present invention.

FIG. 2 is a graph showing the results of experiments in the present application.

FIG. 3 is a graph showing the results of Experiment 1 in the present application.

FIG. 4 is a graph showing the results of Experiment 2 in the present application.

FIG. 5 is a graph showing the results of Experiment 3 in the present application.

FIG. 6 is a graph showing the results of Experiment 4 in the present application.

FIG. 7 is a graph showing the results of Experiment 5 in the present application.

FIG. 8 is a graph showing the results of Experiment 6 in the present application.

FIG. 9 is a graph showing the results of Experiment 7 in the present application.

FIG. 10 is a graph showing the results of Experiment 8 in the present application.

FIG. 11 is a graph showing the results of Experiment 9 in the present application.

FIG. 12 is a graph showing the results of Experiment 10 in the present application.

FIG. 13 is a graph showing the results of Experiment 11 in the present application.

DESCRIPTION OF EMBODIMENTS

FIG. 1 is a schematic diagram illustrating one configuration of a preferred example of an embodiment of production and supply system 100 of high-temperature and high-concentration ozone water of the present invention.

Since the configuration of the ozone water production and supply system 100 is the same as that of the experimental apparatus used for examining the present invention, FIG. 1 will be used in the following description of Examples and Comparative Examples.

FIG. 2 is a graph for explaining a typical example of data supporting the present invention, which is obtained by systematically conducting a number of experiments repeatedly and systematically from a multi-viewpoint using the production and supply system 100 for high-temperature and high-concentration ozone water shown in FIG. 1. The horizontal axis represents the ozone gas supply pressure (MP), and the vertical axis represents the ozone water concentration (ppm).

As will be apparent from the following description, the present invention is based on the finding by the inventors of the present application that, when the ozone gas supply pressure (MP) is 0.15 or more as shown in FIG. 2, experimental results can be obtained in which the ozone concentration in the ozone water to be produced rises more rapidly than in the case where the ozone gas supply pressure (MP) is less than 0.15, by setting certain specific numerical values for some specific production parameters.

Specifically, the experimental results having the tendency shown in FIG. 2 is obtained by conducting the following steps:

(Step A): A solution A is prepared in which at least one of hydrochloric acid, acetic acid, and citric acid is added to pure water to adjust the pH to a predetermined value (pH);

(Step B): Ozone gas supplied at a predetermined supply flow rate (Fo) and at a predetermined supply pressure (Po) is supplied at a predetermined supply flow rate (Fw) to dissolve the solution A in the solution B at a predetermined supply pressure (Pw); and (Step C): Heat so that the temperature of the produced ozone water reaches a predetermined temperature, wherein when ozone water is produced by the above-mentioned processes, (a) The pH value in Step A is set to 4 or less, (b) The concentration N (g/m3) of the ozone gas in Step B is 200 g/m3≤N, Po and Pw is within the following ranges:

0.15 MPa≤Po≤0.695 MPa, 0.15 MPa<Pw≤0.7 MPa

The value of (Po-Pw) has the following relation:

0.005 MPa≤Po−Pw≤0.2 MPa,

And Fo and Fw are within the following ranges:

0.25 NL/min≤Fo≤80 NL/min 0.5 L/min≤Fw≤40 L/min, (c) Predetermined temperature in Step C is within the range of from 60° C. to 90° C. and, (d) Step C is performed at a timing that includes at least before, after, or at the same time as Step B.

Also, even if the above Step C is omitted, the experimental result of the tendency shown in FIG. 2 can be obtained in the same manner. However, it is possible to further increase the removal efficiency of the resist and the like, the detergency of the contaminant and the sterilizing power by utilizing the ozone water obtained by carrying out the process procedure including the above Step C and the production conditions.

As shown in FIG. 2, the increasing tendency of the concentration of the ozone water greatly changes between the low pressure side and the high pressure side of a boundary of 0.15 MPa of the ozone gas pressure (ozone supply pressure: Po). That is, with an increase in the ozone gas pressure at a boundary of 0.15 MPa, the rate of increase in the ozone water concentration on the low pressure side is moderate, whereas the rate of increase in the ozone water concentration on the high pressure side is remarkably large.

Generally, when a dilute solution (dilute aqueous solution) containing a volatile solute (ozone) is in equilibrium with the gas phase, obeying Henry's law, the partial pressure (p) of the solute is proportional to the concentration (c) in the solution.

However, the three measurement points X1, X2, and X3 shown in FIG. 2 are substantially on the first-order dashed line A, while the measurement points X4 and X5 are greatly deviated from the first-order dashed line A.

The three measurement points X3, X4 and X5 have not yet been technically determined whether they should be viewed as being substantially on the first-order dashed line B (first-order approximation) or they should be viewed as being substantially on the second-order dashed line C (second-order approximation).

In any case, under the above production conditions, why the tendency shown in FIG. 2 is seen is not yet elucidated, but it is speculated to be caused by, in addition to the production conditions of (a), (b) and (c) described above, the presence of lifetime of ozone as a solute in water as a solvent.

Furthermore, various acids were tried as the acid to be used for adjusting the pH value, and as a result, the tendency shown in FIG. 2 was not obtained with nitric acid or the like, but the tendency shown in FIG. 2 was remarkably obtained with hydrochloric acid, acetic acid, and citric acid. Accordingly, it is considered that the influence of these acids may be a cause.

Alternatively, it is conceivable that the ozone concentration in the ozone water produced by the ozone water production method of the present invention may not be in a sufficiently dilute state to conform to Henry's law.

In the present invention, the Step A is performed at least before the Step B. Further, the Step B may be performed before or after the Step C, or simultaneously with at least a portion of the step C. Preferably, it is desirable to carry out said Step B after said Step C.

It is preferable that the Step B is started at the same time as the start of the Step C or after the start of the Step C, and is performed overlapping with the Step C. Further, the end of the Step B is preferably after or at the end of the Step C.

Next, a high-temperature high-concentration ozone water production and supply system 100 of the present invention shown in FIG. 1 will be described.

The ozone water production and supply system 100 includes a hot water production module unit 101, an ozone gas dissolving module unit 102, and an ozone water supply module unit 103.

In the example of FIG. 2, the ozone water supply module unit 103 is provided, but the ozone water production and supply system according to the present invention does not necessarily include the ozone water supply module unit 103.

The hot water production module unit 101 includes a pH adjustment unit 101-1 and a heating unit 101-2. The hot water production module unit 101 is provided with a water solvent supply line 104 for supplying pure water such as ultrapure water from the outside.

The water solvent supply line 104 is, for convenience of description, illustrated as divided into three water solvent supply line portions (104-1 to 104-3) from the upstream side.

The pH adjustment unit 101-1 includes a flow rate adjustment valve 127, a static mixer 128, a conductivity meter 129, and a chemical supply device 130.

The chemical supply device 130 includes a chemical solution tank 124, a part of a chemical supply line 125, and a pump 126.

For convenience of description, the chemical supply line 125 is shown as divided into three chemical supply line portions (125-1 to 125-3) from the upstream side.

The water solvent supply line 104 is disposed in the ozone water production and supply system 100 so as to supply heated water heated to a predetermined temperature to the ozone gas dissolving module unit 102 via the heating unit 101-2.

The water solvent supply line 104 supplies pure water such as ultrapure water from outside the production and supply system 100 of ozone water to the pH adjusting unit 101-1, and supplies the pH adjusted pure water to the heating unit 101-2.

The water solvent flowing through the water solvent supply line 104 is heated to a predetermined temperature by heating means 123, if necessary.

A flow meter (F1) 108 is provided at a predetermined position of the water solvent supply line portion 104-2 on the upstream side of the water solvent supply line 104, and a thermocouple (T1) 109, a static mixer 128, a conductivity meter 129, and a pH meter 134 are provided at predetermined positions of the water solvent supply line portion 104-3 on the downstream side of the water solvent supply line 104.

The thermocouple (T1) 109 is used for measuring the temperature of the water solvent flowing through the water solvent supply line portion 104-3, and is also used for monitoring whether or not the temperature of the water solvent has reached a desired temperature.

The static mixer 128 is a static type mixer for stirring and mixing ultrapure water supplied from the water solvent supply line portion 104-1 and a chemical solution such as citric acid supplied from the chemical supply line portion 125-3 into a uniform solution.

The downstream side of the water solvent supply line portion 104-3 communicates with the ozone gas dissolution module unit 102.

The flow rate adjustment valve 127 is a valve for adjusting a flow rate of the chemical solution supplied from the chemical supply line portion 125-3 so that the ultrapure water supplied from the water solvent supply line portion 104-1 and the chemical solution supplied from the chemical supply line portion 125-3 have a predetermined mixing ratio.

The conductivity meter 129 is a measuring unit that monitors whether or not the conductivity of the chemical-containing water solvent flowing through the water solvent supply line portion 104-2, which has been formed by stirring and mixing the ultrapure water and the chemical solution by the static mixer 128 into a uniform solution, is a desired value. The conductivity meter 129 can make measurement not only when necessary but also when the agent-containing water solvent is flowing, either intermittently or continuously.

At a timing when the data measured by the conductivity meter 129 is sent to a predetermined control device (not shown), a control signal for controlling the pumping amount of the pump 126 or/and the valve opening of the flow rate adjustment valve 127 is output from the control device and transferred to the pump 126 or/and the flow rate adjustment valve 127. As a result, the conductivity of the water solvent flowing through the water solvent supply line 104 can be maintained or changed to a predetermined value.

The ozone gas dissolving module unit 102 includes an ozone gas dissolving device 102-1.

The ozone gas dissolving device 102-1 has a structure in which a portion of the ozone gas supply line 106 is disposed and, ozone gas flowing through the ozone gas supply line 106 is dissolved in a water solvent supplied to the ozone gas dissolving device 102-1 by the water solvent supply line 104.

In the present invention, the ozone gas can be produced by the following production method, but in particular, a discharge method is preferred because the adjustment of the supply pressure is easy and a high concentration of ozone gas is obtained. The reason is that when the ozone gas concentration increases, the ozone water concentration also increases. The resist removal rate by ozone water is improved almost linearly in proportion to the supplied ozone gas concentration, and the detergency and sterilization power are also improved (Non PTL 3).

1. Discharge method

The silent discharge method and the creeping discharge method have been used practically mainly from the principle of the discharge.

(1) An oxygen-containing gas is flowed between a pair of electrodes arranged in a parallel plate shape or a coaxial cylinder shape, and an alternating high voltage is applied to cause discharge in the oxygen-containing gas to generate ozone.
One or both surfaces of the pair of electrodes must be coated with a dielectric, such as glass. The discharge is generated in the gas (air or oxygen) as the charge on the dielectric surface alternates between positive and negative.

(2) Creeping discharge method is a method of using a planar electrode whose surface is coated with a dielectric such as ceramics, placing a linear electrode on the surface of the dielectric, and applying an AC high voltage between the flat electrode and the linear electrode to form a discharge on the surface of the dielectric to generate ozone. This method is called a creeping discharge method, because the discharge generated on the surface of the dielectric is called a creeping discharge.

2. Electrolytic Method

A method of placing a pair of electrodes with an electrolyte membrane sandwiched therebetween, in water, and applying a DC voltage between the electrodes to cause electrolysis of water to generate ozone together with oxygen in the oxygen-generation side.

A practical electrolytic ozone generator uses porous titanium with a platinum catalyst layer in the cathode, porous titanium with a lead dioxide catalyst layer in the anode, and a perfluorosulfonate cation exchange membrane as the electrolyte membrane. Electrolytic method can generate high-concentration ozone of 20% by weight or more.

3. Ultraviolet Lamp Method

Ultraviolet rays are applied to air to generate ozone. Usually, a mercury lamp is used as a ultraviolet lamp.

The ozone gas supply line 106 is shown as divided into three ozone gas supply line portions 106-1 to 106-3 for convenience of explanation.

Pressure gauge (P3) 110 is provided at a predetermined position of the ozone gas supply line portion 106-1, the ozone gas supply line portion 106-2 and the ozone gas supply line portion 106-3 are connected via a pressure regulating valve 118.

The downstream side of the ozone gas supply line portion 106-3 may be connected to an ozone gas treatment system, and may be changed into harmless and exhausted, or may be connected to a recycle type ozone gas supply device to have a facility configuration for reusing ozone gas.

The pressure regulating valve 118 may be a valve of simple ON-OFF operation having a constant opening size, or it may be a valve capable of adjusting the size of the opening arbitrarily or stepwisely.

The ozone gas supply line portion 106-1 and the ozone gas supply line portion 106-2 communicate with an ozone gas dissolving means 107 provided inside the ozone gas dissolving device 102-1.

The concentration (N) of the ozone gas supplied by the ozone gas supply line portion 106-1 is determined according to the ozone concentration of the ozone water to be produced, but is generally desirably higher.

In the present invention, it is preferable that the concentration (N) of the ozone gas is desirably within a range of the following formula (1).

$$200 \text{ g/Nm}3 \leq N \tag{1}$$

In the ozone gas dissolving means 107, the ozone gas supplied by the ozone gas supply line 106 and the water solvent supplied by the water solvent supply line 104 come into gas-liquid contact with each other to form ozone water.

As the ozone gas dissolving means 107, various types may be employed as long as they meet the object of the present invention. Among them, it is preferable to employ a dissolution means using a membrane dissolution method.

As a membrane dissolution method, it is preferable to employ a method in which water is flowed through a porous Teflon (registered trademark) membrane (septum: hollow fiber membrane), and ozone gas is flowed outside the membrane to absorb ozone into water to produce ozone water.

As a device for dissolving ozone gas in a water solvent, in addition to the ozone gas dissolving device 102-1 of the type shown in FIG. 1, the following devices may be employed.

(1) Ozone Gas Dissolving Device Using Bubble Dissolving Method (Bubbling Method)

Ozone gas dissolving device of a type which blows ozone gas from the lower part of the water tank, or of a type which uses an ejector method of blowing ozone gas into a narrow part provided in a part of the piping of the water, or a method of stirring water and ozone gas with a pump (2) Ozone Gas Dissolving Device Using Bubble-Free Gas Dissolving Method This method uses a SPG Membrane: a shirasu porous glass membrane. Although SPG membranes have hydrophilic inner wall surfaces, there is also a SPG membrane in which the inner wall surface is hydrophobized. Which one to use is preferably selected depending on its purpose.

(3) Ozone Gas Dissolving Device Using Packed Bed Dissolving Method

Ozone gas dissolving device using a method of flowing water from the upper part of the packed bed and flowing ozone gas from the lower part of the packed bed to dissolve ozone in the packed bed in a gas-liquid counter-current manner.

In any of the above-mentioned ozone gas dissolving device, it is important to devise to make the gas-liquid contact area as large as possible from the viewpoint of ozone water generation efficiency.

The ozone water formed in the water solvent supply line 104 is supplied to a surface to be processed of a member to be processed, such as a semiconductor substrate, through the ozone water supply line 105.

A pressure gauge (P1) 111, an ozone water concentration meter 112, a pressure gauge (P2) 113, and an ozone water concentration meter 114 are provided at predetermined positions of the ozone water supply line portion 105-1 from the upstream side.

Although the pressure gauge (P1) 111 and the ozone water concentration meter 112 can be essentially replaced with each other, it is preferable to provide the ozone water concentration meter 112 at a position as close as possible to the ozone gas dissolving means 107 within a design allowable range in order to measure the ozone concentration of the ozone water immediately after it is generated by the ozone gas dissolving means 107.

An ozone water supply line 105 for supplying ozone water generated in the ozone gas dissolving module unit 102 is connected to the ozone water supply unit 103.

The ozone water generated in the ozone gas dissolving module unit 102 is flowed to a predetermined position of the ozone water supply unit 103 through the ozone water supply line 105.

In FIG. 1, the ozone water supply line 105 is composed of six ozone water supply line portions (105-1 to 105-6) for convenience of explanation.

The ozone water supply line portion 105-1 and the ozone water supply line portion 105-2 communicate with each other via a three-way open-close valve 119. The ozone water supply line portion 105-2 and the ozone water supply line portion 105-4 communicate with each other via the open-close valve 120. A nozzle 122 is provided at the downstream end of the ozone water supply line portion 105-4. The ozone water supply line portion 105-3 extends from the three-way open-close valve 119 and is connected to the open-close valve 121. An ozone water supply line portion 105-5 is connected to the downstream end of the open-close valve 121. A thermocouple (T2) 115 and a flow meter (F2) 116 are provided at predetermined positions of the ozone water supply line portion 105-5 from the upstream side. Near the discharge port of the nozzle 122, a nozzle thermometer (T3) for measuring the temperature of the ozone water discharged is provided.

Although the ozone water supply line 105 is composed of six ozone water supply line portions (105-1 to 105-6) in FIG. 1, in another preferred embodiment, the three-way open-close valve 119 and the ozone water supply line portions 105-3, 105-5, and 105-6 are unnecessary. In this embodiment, the thermocouple (T2) 115 for measuring the temperature of the ozone water flowing through the ozone water supply line 105 and the flow meter (F2) for measuring the flow rate are provided at desired positions of the ozone water supply line 105-2 provided on the upstream side of the open-close valve 120, as necessary.

Next, an example of a suitable procedure for producing and supplying ozone water by the production and supply system 100 of high-temperature high-concentration ozone water will be described.

The ultrapure water supplied as indicated by an arrow (A1) from the water solvent supply line 104 connected to a house line (not shown) is mixed uniformly with a predetermined acid solution (chemical solution) such as citric acid supplied from the chemical solution tank 124 through the chemical supply line 125 in the static mixer 128 to have conductivity adjusted to a predetermined value to dissolve ozone gas.

The flow rate of the chemical solution is controlled to be a predetermined value by adjusting the pump force of the pump 126 and the valve opening degree of the flow rate adjustment valve 127.

The value of the conductivity to be adjusted is measured by the conductivity meter 129. The water solvent (A) whose conductivity is adjusted is sent to the heating means 123 through the water solvent supply line portion 104-2, and is heated to a predetermined temperature if necessary.

The flow rate (F1) of the water solvent (A) flowing through the water solvent supply line portion 104-2 is measured by a flow meter (F1) 108.

As indicated by the arrow A2, the water solvent (B) heated if necessary is output from the heating means 123 to the outside of the hot water production module unit 101 via the water solvent supply line portion 104-3.

The temperature (T1) of the water solvent (B) is measured by a thermocouple (T1) 109.

The water solvent (B) is supplied to the ozone gas dissolving device 102-1 via the water solvent supply line portion 104-3 to fill a predetermined space region provided in the ozone gas dissolving device 102-1.

The supply pressure of the water solvent (B) to be supplied into the ozone gas dissolving device 102-1 is measured by a pressure gauge (P0) 111-1.

The pressure of the ozone water output from the ozone gas dissolving device 102-1 is measured by a pressure gauge (P1) 111-2. Pressure gauge (P1) 111-2 is for measuring the pressure of the ozone water immediately after output from the ozone gas dissolving device 102-1, and is preferably provided as close as possible to the ozone gas dissolving device 102-1 so long as the design allows.

On the other hand, the ozone gas is guided into the ozone gas dissolving device 102-1 through the ozone gas supply line portion 106-1.

An ozone gas dissolving means 107 is provided in the middle of the ozone gas supply line 106, and the gas supply pressure (Po) of the ozone gas supplied to the ozone gas dissolving means 107 is measured as a value P3 by a pressure gauge (P3) 110. Therefore, it is preferable that the pressure gauge P3 110 be provided as close as possible to the ozone gas dissolving means 107 so long as the design allows.

The gas supply pressure (Po) of the ozone gas supplied to the ozone gas dissolving means 107 is controlled by adjusting the degree of opening of the pressure regulating valve 118.

The ozone gas dissolving means 107 shown in FIG. 1 has a pipe structure in a spiral shape in order to have a large gas-liquid contact surface as much as possible in a limited length in the flow direction of the gas, but the present invention is not limited to this shape and structure, and it may have any shape and structure as long as it can be accommodated in the inner space (filled with water solvent) of the ozone gas dissolving device 102-1, and it has a gas-liquid contact surface area sufficient to achieve the object of the present invention.

Further, in FIG. 1, although an example of a structure in which the inner space of the ozone gas dissolving device 102-1 is filled with water solvent is shown, a structure may be employed in which the inner space of the ozone gas dissolving device 102-1 is filled with ozone gas, and the supply line of the water solvent passes therethrough.

One of the constitutional requirements of the present invention is that the gas supply pressure (Po) and the supply flow rate (Fo) of the ozone gas supplied to the ozone gas dissolving means 107 in the ozone gas dissolving device 102-1 through the ozone gas supply line portion 106-1 are closely related to the supply pressure (Pw) and the supply flow rate (Fw) of the water solvent supplied to the ozone gas dissolving device 102-1 through the water solvent supply line 104, respectively.

In the present invention, the values of Po and Pw are specified in the following ranges:

$$0.15\ \text{MPa} \leq Po \leq 0.695\ \text{MPa} \tag{2}$$

$$0.15\ \text{MPa} < Pw \leq 0.7\ \text{MPa} \tag{3}$$

Preferably, the value of Po is in the following range of $$0.175\ \text{MPa} \leq Po \leq 0.695\ \text{MPa} \tag{2'}$$

Po and Pw preferably have the following relationship:

$$0.005\ \text{MPa} \leq (Pw - Po) \leq 0.2\ \text{MPa}, \tag{4}$$

$$Po < Pw \tag{5}$$

By making the relationship of Formula (5), it is possible to suppress or prevent the generation of bubbles in the water solvent.

The value of Fo and Fw value are preferably is in the following ranges:

$$0.25\ \text{NL/min} \leq Fo \leq 80\ \text{NL/min} \tag{6}$$

$$0.5\ \text{L/min} \leq Fw \leq 40\ \text{L/min} \tag{7}$$

The value of Fo is preferably, $$0.5 \text{ NL/min} \leq Fo \leq 80 \text{ NL/min} \tag{6'}$$

It is even more preferable to set Fo in the above range.

In the system 100 of FIG. 1, the gas supply pressure (Po) of the ozone gas is measured as a value P3 by a pressure gauge (P3) 110, the supply flow rate (Fo) of the ozone gas is measured as a value F3 by a flow meter (F3) 131.

The supply pressure (Pw) of the water solvent is measured as the value Po by the pressure gauge (P0) 111-1 or as a value P1 by the pressure gauge (P1) 111-2, and the supply flow rate (Fw) of the water solvent is measured as a value F1 by the flow meter (F1) 108.

Undissolved ozone gas may be discarded to the outside as indicated by the arrow A9 through the ozone gas supply line portion 106-3, or may be circulated from the ozone gas supply line portion 106-1 to the ozone gas dissolving means 107 as indicated by the arrow A8 to be reused.

The ozone water generated in the ozone gas dissolving module unit 102 is supplied to a predetermined position of the ozone water supply unit 103 through the ozone water supply line 105.

Ozone water formed in the water solvent supply line 104, when it is supplied to the surface to be treated of the member to be treated such as a semiconductor substrate, is supplied to the nozzle means 122 via the ozone water supply line portion 1051-1, 105-2, and 105-4, and is sprayed onto the surface to be treated of the member from the discharge port of the nozzle means 122.

When no experiment is conducted to treat the surfaces of the member to be treated, the flow path direction of the three-way open-close valve 119 is switched so that the generated ozone water flows out in the direction of the arrow A7 through the ozone water supplying line portions 105-3, 105-5, and 105-6.

The supply pressure of the ozone water flowing through the ozone water supply line portion 105-3 is measured by the pressure gauge 131 as necessary.

The supply pressure of ozone water flowing through the ozone water supply line portion 105-5 is measured by the pressure gauge 132, the temperature is measured by the thermocouple 115, and the flow rate is measured by the flow meter 116, as necessary.

The concentration of ozone water flowing through the point A on the ozone water supply line portion 1051-1 is measured by an ozone water concentration meter 112.

In order for the concentration of the ozone water flowing through the point A to become a predetermined concentration, the concentration and the flow rate and the supply pressure of the ozone gas flowing through the ozone gas supply line portion 106-1 and the flow rate and the supply pressure of the water solvent flowing through the water solvent supply line portion 104-3 are adjusted so as to have predetermined values in the ranges of the above equations (1) to (7)

EXAMPLES

Experiments on examples and comparative examples supporting the present invention using the ozone water production and supply system apparatus shown in FIG. 1 were carried out as follows.

Experiment 1

An experiment was carried out under the following production conditions. The results are shown in FIG. 3.

The horizontal axis represents the ozone gas (supply) pressure (Po=P3) (MPa), and the vertical axis represents the ozone water concentration (ppm).

[Production Conditions]
pH adjusting additive:
Hydrochloric acid, adjusted to a concentration of 0.24 wt % and pH1.2 (at 22° C.)
Ultrapure water:
(Supply) Flow rate (F1) 1 L/min, (Supply) Pressure (P1=Pw) 0.25 MPa
Ozone gas:
(Supply) Concentration (N) 350 g/Nm3, (Supply) Flow rate (Fo=F3) 5 NL/min,
(Supply) Pressure (Po=P3) 0.01 to 0.24 MPa
Chemical solution temperature (T1) (heating temperature of ultrapure water after pH adjustment and before ozone gas dissolution) 80° C.

As shown in FIG. 3, the ozone gas (supply) pressure (Po=P3) dependence of the ozone water concentration (dissolved concentration of ozone) shows greatly different results between pressure regions of greater than 0.15 MP and less than 0.15 MP. In other words, in terms of increase rate of the ozone water concentration, it has been shown that the increase rate of the ozone water concentration in the range of 0.15 MP or more in the ozone gas (supply) pressure (Po=P3) is much larger than the increase rate of the ozone water concentration in the range of 0.15 MP or less in the ozone gas (supply) pressure (Po=P3).

Moreover, the result is that ozone water having an ozone water concentration of about 650 ppm is obtained at a chemical solution temperature of 80° C. and an ozone gas supply pressure of 0.24 MPa.

Experiment 2

An experiment was carried out under the following production conditions. The results are shown in FIG. 4.

The horizontal axis represents the ozone gas (supply) pressure (Po=P3) (MP), and the vertical axis represents the ozone water concentration (ppm).

[Production Conditions]
pH adjusting additive:
Citric acid, adjusted to a concentration of 1.0 wt %, and pH 2.2 (at 22° C.)
Ultrapure water:
(Supply) Flow rate (F1) 1 L/min, (Supply) Pressure (P1=Pw) 0.25 MPa
Ozone gas;
(Supply) Concentration (N) 350 g/Nm3, (Supply) Flow rate (Fo=F3) 5 NL/min,
Supply pressure (P3) 0.01 to 0.24 MPa
Chemical solution temperature (T1) (heating temperature of ultrapure water after pH adjustment and before ozone gas dissolution) 80° C.

As shown in FIG. 4, the ozone gas (supply) pressure (Po=P3) dependence of the ozone water concentration (dissolved concentration of ozone) shows greatly different results between pressure regions of 0.15 MP or less and greater than 0.15 MP. In other words, in terms of increase rate of the ozone water concentration, it has been shown that the increase rate of the ozone water concentration in the range of 0.15 MP in the ozone gas (supply) pressure (Po=P3) is much larger than the increase rate of the ozone water concentration in the range of 0.15 MP or less in the ozone gas (supply) pressure (Po=P3).

Moreover, the result is that ozone water having an ozone water concentration of about 750 ppm is obtained at a chemical solution temperature of 80° C. and an ozone gas supply pressure of 0.24 MPa.

Experiment 3

An experiment was carried out under the following production conditions. The results are shown in FIG. 5.

The horizontal axis represents the ozone gas (supply) pressure (Po=P3) (MP), and the vertical axis represents the ozone water concentration (ppm).

[Production Conditions]

pH adjusting additive: acetic acid
Concentration 12.0 wt %, pH2.2 (at 22° C.)
  Ultrapure water flow rate (F1) 1 L/min, pressure (P1) 0.25 MPa
  Ozone gas
  (Supply) Concentrations 350 g/Nm3, (Supply) Flow rate 5 NL/min
  (Supply) Pressure (P3) 0.01 to 0.24 MPa
  Chemical solution temperature (T1) (heating temperature of ultrapure water after pH adjustment and before ozone gas dissolution) 80° C.

As shown in FIG. 5, the ozone gas (supply) pressure (Po=P3) dependence of the ozone water concentration (dissolved concentration of ozone) shows greatly different results between pressure regions of 0.15 MP or less and greater than 0.15 MP. In other words, in terms of increase rate of the ozone water concentration, it has been shown that the increase rate of the ozone water concentration in the range of 0.15 MP in the ozone gas (supply) pressure (Po=P3) is much larger than in the increase rate of the ozone water concentration in the range of 0.15 MP or less in the ozone gas (supply) pressure (Po=P3).

Moreover, the result is that ozone water having an ozone water concentration of about 850 ppm is obtained at a chemical solution temperature of 80° C. and an ozone gas supply pressure of 0.24 MPa.

In the following Experiments 4-6, ozone waters were produced to conduct experiments to confirm their resist removal effects. As substrates to be processed, semiconductor substrates each having a surface on which a resist (a KrF-positive resist TDUR-P3116EM 15cp manufactured by Tokyo Ohka Kogyo Co., Ltd., pre-baking at 90° C. for 90 seconds, post-baking at 110° C. for 90 seconds, and a film thickness of 750 nanometers) was applied by a spinner were used.

Experiment 4

An experiment for confirming the effect of resist removal was carried out using ozone water prepared under the following production conditions. The results are shown in FIG. 6.

The horizontal axis represents the ozonized water concentration (ppm), and the vertical axis represents the resist removal rate (nm/min).

[Ozone Water Production Conditions]

pH adjusting additive: hydrochloric acid
Concentration 0.24 wt. %, pH1.2 (at 22° C.)
  Ultrapure water flow rate (F1) 1 L/min, pressure (P1) 0.25 MPa
  Ozone gas:
  (Supply) Concentrations 350 g/Nm3, (Supply) Flow rate 5 NL/min
  (Supply) Pressure (P3) 0.01 to 0.24 MPa
  The ultrapure water is heated so that the temperature of the chemical (ozone water) sprayed from the nozzle 122 becomes 80° C.

[Resist Removal Conditions]

The ozone water produced under the above production conditions was sprayed from the nozzle 122 onto the resist coating surface of the substrate to be processed.
  Temperature of the chemical (ozone water) sprayed from the nozzle 122: 80° C.
  Measured with a nozzle thermometer (T3) 117
    During processing, hot water is sprayed onto the back surface of the substrate to be processed (the surface on which the resist is not applied)
  Temperature of hot water 90° C., spray flow rate 3 L/min The results are shown in FIG. 6.

As shown in FIG. 6, in the range of ozone water concentration of 400-600 ppm, the results of extremely high resist removal effect with resist removal rate of 2000-2200 nm/min were obtained.

Experiment 5

An experiment for confirming the effect of resist removal was carried out using ozone water prepared under the following production conditions. The results are shown in FIG. 7.

The horizontal axis represents the ozonized water concentration (ppm), and the vertical axis represents the resist removal rate (nm/min).

[Ozone Water Production Conditions]

pH adjusting additive: citric acid
Concentration 1.0 wt %, pH2.2 (at 22° C.)
  Ultrapure water:
  Flow rate (F1) 1 L/min, Pressure (P1) 0.25 MPa
  Ozone gas:
  (Supply) Concentrations 350 g/Nm3, (Supply) Flow rate 5 NL/min
  (Supply) Pressure (P3) 0.01 to 0.24 MPa
  The ultrapure water is heated so that the temperature of the chemical (ozone water) sprayed from the nozzle 122 becomes 80° C.

[Resist Removal Conditions]

The ozone water produced under the above production conditions was sprayed from the nozzle 122 onto the resist coating surface of the substrate to be processed.
  Temperature of the chemical (ozone water) sprayed from the nozzle 122: 80° C.
  Measured with a nozzle thermometer (T3) 117
    During processing, hot water is sprayed onto the back surface (the surface on which the resist is not applied) of the substrate to be processed.
  Temperature of hot water 90° C., spray flow rate 3 L/min The results are shown in FIG. 7.

As shown in FIG. 7, in the range of ozone water concentration of 400-600 ppm, the results of extremely high resist removal effect with resist removal rate of 1600-1800 nm/min were obtained.

Experiment 6

An experiment for confirming the effect of resist removal was carried out using ozone water prepared under the following process conditions. The results are shown in FIG. 8. The horizontal axis represents the ozonize water concentration (ppm), and the vertical axis represents the resist removal rate (nm/min).

[Ozone Water Production Conditions]
pH adjusting additive: acetic acid
Concentration 1.0 wt %, pH2.2 (at 22° C.)
  Ultrapure water:
Flow rate (F1) 1 L/min, Pressure (P1) 0.25 MPa
  Ozone gas:
(Supply) Concentrations 350 g/Nm3, (Supply) Flow rate 5 NL/min
(Supply) Pressure (P3) 0.01 to 0.24 MPa
  The ultrapure water is heated so that the temperature of the chemical (ozone water) sprayed from the nozzle 122 becomes 80° C.
[Resist Removal Conditions]
The ozone water produced under the above production conditions was sprayed from the nozzle 122 onto the resist coating surface of the substrate to be processed.
  Temperature of the chemical (ozone water) sprayed from the nozzle 122: 80° C.
Measured with a nozzle thermometer (T3) 117
  During processing, hot water is sprayed onto the back surface of the substrate to be processed (the surface on which the resist is not applied)
  Temperature of hot water 90° C., spray flow rate 3 L/min
The results are shown in FIG. 8.
As shown in FIG. 8, in the range of ozone water concentration 600 to 800 ppm, the results of extremely high resist removal effect around a resist removal rate of 1600 nm/min was obtained.
In the following Experiments 7 and 8, ozone water was prepared, and experiments for confirming the life thereof were carried out.
In the experiments, the ozone water supply line 105 was filled with the ozone water produced by the ozone gas dissolving module unit 102, and then the open-close valve 120 was closed to confine the ozone water in the ozone water supply line portion 105-1, and measured the time change of the ozone concentration by the ozone water concentration meters 112 and 114 in the confinement time range of from 0 to 300 seconds.
The ozone water concentration meter 112 was set at a position of 0.2 cm (measurement position at 0 sec: point A) from the ozone gas dissolving device 102-1, and the ozone water concentration meter 114 was set at a position of 3 m (measurement position at 3 to 300 sec: point B) from the ozone gas dissolving device 102-1.

Experiment 7

As pH-adjusting additives, acetic acid, citric acid, and hydrochloric acid were used to prepare chemical solutions of pH2.2 (22° C.), respectively.

Experiment 7-1 pH-adjusting additive: acetic acid, concentration 120 wt %, pH2.2 (22° C.)

Experiment 7-2 pH-adjusting additive: citric acid, concentration 1.0 wt %, pH2.2 (22° C.)

Experiment 7-3 pH-adjusting additive: hydrochloric acid, concentration 0.02 wt %, pH2.2 (22° C.)

Other conditions were common to Experiments 7-1 to 7-3 as follows.
  Ultrapure water:
Flow rate (F1) 1 L/min (measured by flow meter 108),
Pressure (P2) 0.25 MPa (measured with pressure gauge 113)
  Ozone gas:
(Supply) Concentrations 380 g/Nm3, (Supply) Flow rate 5 NL/min (measured by ozonizer)
(Supply) Pressure (P3) 0.24 MPa (measured with pressure gauge 110)
  Chemical solution (ozone water) temperature: 22° C.
The results are shown in FIG. 9.
As shown in FIG. 9, in the cases of acetic acid and citric acid, in the initial state (0 seconds), ozone water of a quite high concentration of 1100 ppm or more is obtained, and even after 300 seconds elapsed, an ozone water concentration of about 300 ppm is maintained.
In comparison, in the case of hydrochloric acid, in the initial state (0 seconds), the ozone water concentration is about 800 ppm, and in addition, the ozone water concentration is attenuated to about 100 ppm at an elapsed time of about 60 seconds.
In other words, as compared with the case of hydrochloric acid, in the case of acetic acid and citric acid, it was confirmed by experiments that a quite high concentration of ozone water can be obtained, and moreover, a high concentration can be maintained for a suitable long time.
This infers that acetic acid and citric acid are much better than hydrochloric acid in the decomposition suppressing power of ozone in ozone water.
From the result of FIG. 9, it can be confirmed that in the case of acetic acid and citric acid, if ozone water treatment is carried out in the position within the elapsed time of 50 seconds, the treatment can be performed with high-concentration ozone water of about 600 ppm or more.

Experiment 8

Experiments were carried out under the same conditions as in Experiment 7, except that the chemical solution (ozone water) temperature was set at 80° C.
The results are shown in FIG. 10.
As FIG. 10 shows, despite the high temperature of 80° C., high-temperature high-concentration ozone waters are obtained in which the ozone water concentration at the initial state (0 seconds) is more than 600 ppm in hydrochloric acid, about 750 ppm in citric acid, and about 850 ppm in acetic acid.
In the cases of acetic acid and citric acid, the ozone water concentration of about 300 ppm is maintained even around an elapsed time of 90 seconds.
This infers that acetic acid and citric acid have considerable degree of decomposition suppressing power of ozone even in the case of high temperature ozone water.
In comparison, in the case of hydrochloric acid, the ozone water concentration has already attenuated to about 100 ppm at about 60 seconds elapsed.
In other words, it was confirmed by experiments that in the cases of acetic acid and citric acid, higher-temperature higher-concentration ozone water than the case of hydrochloric acid can be obtained, and moreover, the high concentration can be maintained for longer time.
This seems to indicate that acetic acid and citric acid are much better than hydrochloric acid in the decomposition suppressing power of ozone in water even in high-temperature ozone water.

From the result of FIG. 10, it can be confirmed that in the case of acetic acid and citric acid, if ozone water treatment is carried out at the position within an elapsed time of 100 seconds or less, the treatment can be performed reliably with high-temperature high-concentration ozone water of about 300 ppm or more.

Experiment 9

Experiments to investigate pH dependence of ozone water concentration using various pH adjusting additives were carried out under the following production conditions:
[Ozone Water Production Conditions]
Ultrapure water:
(Supply) Flow rate (F1) 1 L/min, (Supply) Pressure (P2) 0.25 MPa
Ozone gas:
(Supply) Concentration (N) 350 g/Nm3, (Supply) Flow rate (Fo) 5 NL/min
(Supply) Pressure (P3) 0.2 MPa
Chemical solution temperature: 22° C.
The results are shown in FIG. 11.
FIG. 11 also describes for reference, an example of carbon dioxide addition as a pH adjusting additive.
As can be seen from the data shown in FIG. 11, when the values of the respective production parameters are set to values within the ranges of the above-mentioned equations (1) to (7) and are set to pH4 or less, high-concentration ozone water of about 350 ppm or more can be obtained.

Experiment 10

Experiments regarding the dependence of the ozone water concentration on the ozone gas supply flow rate were carried out under the following production conditions.
[Ozone Water Production Conditions]
pH adjusting additive: citric acid
Concentration 1.0 wt %, pH2.2 (at 22° C.)
Ultrapure water:
(Supply) Flow rate (F1) 1 L/min,
(Supply) Pressure (P1) 0.30 MPa,
(P2) 0.25 MPa
Ozone gas:
(Supply) Pressure (P3) 0.24 MPa
(Supply) Concentrations (N) g/Nm3, (Supply) Flow Rate (Fo) NL/min is shown in Table 1 below.
Chemical solution temperature: 22° C.

TABLE 1

| Ozone gas flow rate [NL/min] | Ozone gas concentration [g/Nm3] | Ozone water concentration [ppm] |
|---|---|---|
| 0.5 | 390 | 339 |
| 2 | 360 | 553 |
| 3 | 350 | 674 |
| 4 | 340 | 783 |
| 5 | 330 | 822 |
| 6 | 320 | 756 |
| 7 | 300 | 678 |

The results are shown in FIG. 12.
As shown in FIG. 12, when the ozone gas flow rate is 0.25 NL/min or more, ozone water having an ozone water concentration of about 340 ppm or more can be obtained.
When the ozone gas flow rate is near 5 NL/min, a peak is seen in the ozone water concentration, and when the ozone gas flow rate exceeds the value at the peak, and the ozone water concentration decreases slowly.
As an upper limit value of the flow rate of the ozone gas is 80 NL/min on the assumption that ozone water having an ozone water concentration of 300 ppm or more is obtained.

Experiment 11

An experiment regarding the dependence of the ozone water concentration on the ultrapure water supply flow rate was carried out under the following production conditions.
[Ozone Water Production Conditions]
pH adjusting additive: citric acid
Concentration 1.0 wt %
pH2.2 (22° C.)
Ultrapure water
(Supply) flow rate (F1) L/min is shown in Table 2 below.
(Supply) Pressure (P1) 0.30 MPa
(P2) 0.25 MPa
Ozone gas:
((Supply) Concentrations 350 g/Nm3
(Supply) Flow rate 5 NL/min
(Supply) Pressure (P3) 0.24 MPa

TABLE 2

| Ultrapure water flow rate [L/min] | Ozone water concentration [ppm] |
|---|---|
| 0.5 | 986 |
| 1 | 822 |
| 2 | 523 |
| 3 | 430 |
| 4 | 397 |
| 5 | 360 |

Results are shown in FIG. 13.
As shown in FIG. 13, the lower the flow rate of ultrapure water, the higher the concentration of ozone water obtained, but from the viewpoint of precisely and easily controlling the flow rate, the lower limit value is set to 0.5 L/min or more.
In terms of upper limit value of the flow rate of ultrapure water, in order to efficiently obtain ozone water having a desired ozone concentration, it is determined by optimizing the balance between the dissolution efficiency of ozone and the production efficiency of ozone water, but in order to obtain ozone water having an ozone concentration of 300 ppm or more, it is desirable to set it to 40 L/min or less.

Experiment 12

In the ozone water production and supply system 100 shown in FIG. 1, a heating means similar to the heating means 123 is provided in a portion of the ozone water supply line portion 105-1 between the ozone gas dissolving module unit 102 and the ozone water supply module unit 103, thereby producing an ozone water production and supply system which is also a post-heating type. The following experiments were carried out using this newly prepared ozone water production and supply system.

(1) Experiment 12-1

In Experiment 1, a series of high-temperature high-concentration ozone water samples were prepared under the same production conditions as in Experiment 1, except that ozone water (low-temperature ozone water) having a liquid temperature of 22° C. was prepared in advance, and then this ozone water was heated to 80° C.

As a result, although the ozone water concentration is slightly lower in each sample than in the results shown in FIG. 4, the ozone gas pressure dependence of ozone water concentration having the tendency shown in FIG. 2 was obtained.

(2) Experiment 12-2

In Experiment 2, a series of high-temperature and high-concentration ozone water samples were prepared under the same production conditions as in Experiment 2, except that ozone water (low-temperature ozone water) having a liquid temperature of 22° C. was prepared in advance, and then this ozone water was heated to 80° C.

As a result, although the ozone water concentration is slightly lower in each sample than in the results shown in FIG. 3, the ozone gas pressure dependence of ozone water concentration having the tendency shown in FIG. 2 was obtained.

(3) Experiment 12-3

In Experiment 3, a series of high-temperature and high-concentration ozone water samples were prepared under the same production conditions as in Experiment 1, except that ozone water (low-temperature ozone water) having a liquid temperature of 22° C. was prepared in advance, and then this ozone water was heated to 80° C.

As a result, although the ozone water concentration was slightly lower in each sample than in the results shown in FIG. 5, the ozone gas pressure dependence of ozone water concentration having the tendency shown in FIG. 2 was obtained.

Experiment 13

Experiments were conducted with one or more of the parameters shown in the above equations (1) to (7) deviated from the numerical range shown in equations (1) to (7). The number of samples was 100.

It was found from this experiment that the tendency shown in FIG. 2 was not observed when the ozone water was prepared with one or more of the parameters shown in the above-mentioned equations (1) to (7) deviated from the numerical range shown in the equations (1) to (7).

In addition, it was observed that the tendency became more distant from one shown in FIG. 2 as the number of parameters among the parameters shown in the equations (1) to (7) deviating from the numerical range shown the equations (1) to (7) increased.

Although the application of the present invention to the semiconductor field has been described above, the application of the present invention is not limited to the application to the semiconductor field, but is also applicable to cleaning of foodstuffs, cleaning of processing facilities and instruments, cleaning of fingers, and the like, and deodorization, sterilization, and preservation of freshness of foodstuffs.

In some applications, the concentration of ozone water is properly diluted and used.

The present invention is not limited to the above embodiments, and various changes and modifications can be made without departing from the spirit and scope of the present invention. Therefore, in order to make the scope of the present invention publicly available, an attachment is attached which sets forth the claims.

REFERENCE SIGNS LIST

100: Ozone water production and supply system
101: Hot water production module unit
101-1: pH adjustment unit
101-2: Heating unit
102: Ozone gas dissolving module unit
102-1: Ozone gas dissolving device
103: Ozone water supply module unit
104: Water solvent supply line
104-1~104-3: Water solvent supply line portion
105: Ozone water supply line
105-1~105-6: Ozone water supply line portion
106: Ozone gas supply line
106-1~106-3: Ozone gas supply line portion
107: Ozone gas dissolving means
108: Flow meter (F1)
109: Thermocouple (T1)
110: Pressure gauge (P3)
111-1: Pressure gauge (P0)
111-2: Pressure gauge (P1)
112: Ozone water concentration meter (point A)
113: Pressure gauge (P2)
114: Ozone water concentration meter (point B)
115: Thermocouple (T2)
116: Flow meter (F2)
117: Nozzle thermometer (T3)
118: Pressure regulating valve
119: Three-way open-close valve
120: Open-close valve
121: Open-close valve
122: Nozzle
123: Heating means
124: Chemical solution tank
125: Chemical supply line
125-1~125-3: Chemical supply line portion
126: Pump
127: Flow rate adjustment valve
128: Static mixer
129: Conductivity meter
130: Chemical supply device
131: Pressure gauge (P4)
132: Pressure gauge (P5)
133: Flowmeter (F3)
134: pH meter

The invention claimed is:

1. A process for producing ozone water comprising:
A: preparing a solution A in which at least one of hydrochloric acid, acetic acid, and citric acid is added to pure water to adjust pH to a predetermined value (pH);
B: dissolving ozone gas supplied at a predetermined supply flow rate (Fo) and a predetermined supply pressure (Po) into solution A supplied at a predetermined supply flow rate (Fw) and a predetermined supply pressure (Pw) to generate solution B; and
C: heating any of the pure water, the solution A, and the solution B so that the liquid temperature of the ozone water to be generated becomes a predetermined temperature, wherein:
(1) the predetermined value (pH) is 4 or less,
(2) a concentration (N) ($g/Nm^3$) of ozone gas is 200 g per $Nm^3 \leq N$, (3) Po and Pw are within the following ranges:
   0.15 MPa≤Po≤0.695 MPa,
   0.1 MPa≤Pw≤0.7 MPa,
   a value of (Pw−Po) is within the following range:
   0.005 MPa≤(Pw−Po)≤0.2 MPa,
   and a relation between Po and Pw is:
   Po<Pw,
(4) Fo and Fw are within the following ranges:
   0.25 NL/min≤Fo≤80 NL/min,
   0.5 L/min≤Fw≤40 L/min,
(5) the predetermined temperature within a range of from 60° C. to 90° C., and
(6) the C: heating any of the pure water, the solution A, and the solution B is performed at a timing that includes at least before, after, or concurrently with the B: dissolving ozone gas.

2. A process for producing ozone water comprising:
A: preparing a solution A in which at least one of hydrochloric acid, acetic acid, and citric acid is added to pure water to adjust pH to a predetermined value (pH);
B: dissolving ozone gas supplied at a predetermined supply flow rate (Fo) and a predetermined supply pressure (Po) into solution A supplied at a predetermined supply flow rate (Fw) and a predetermined supply pressure (Pw) to generate solution B; and
C: heating any of the pure water, the solution A, and the solution B so that the liquid temperature of the ozone water to be generated becomes a predetermined temperature, wherein:
(1) the predetermined value (pH) is 4 or less,
(2) a concentration (N) (g/$Nm^3$) of ozone gas is 200 g per $Nm^3$≤N,
(3) Po and Pw are within the following ranges:
   0.15 MPa≤Po≤0.695 MPa,
   0.1 MPa≤Pw≤0.7 MPa,
   a value of (Pw−Po) is within the following range:
   0.005 MPa≤(Pw−Po)≤0.2 MPa,
   and a relation between Po and Pw is:
   Po<Pw, and
(4) Fo and Fw are within the following ranges:
   0.25 NL/min≤Fo≤80 NL/min,
   0.5 L/min≤Fw≤40 L/min.

3. A process using an ozone water produced by the process as defined in claim 2.

4. The method for producing ozone water according to claim 2, wherein the C: heating any of the pure water, the solution A, and the solution B is not performed.

* * * * *